United States Patent
Sasaki et al.

(10) Patent No.: US 6,598,208 B2
(45) Date of Patent: Jul. 22, 2003

(54) DESIGN AND ASSISTING SYSTEM AND METHOD USING ELECTROMAGNETIC POSITION

(75) Inventors: Hideki Sasaki, Tokyo (JP); Takashi Harada, Tokyo (JP); Toshihide Kuriyama, Tokyo (JP)

(73) Assignee: NEC Corporation, Tokyo (JP)

( * ) Notice: Subject to any disclaimer, the term of this patent is extended or adjusted under 35 U.S.C. 154(b) by 131 days.

(21) Appl. No.: 09/794,918

(22) Filed: Feb. 28, 2001

(65) Prior Publication Data

US 2001/0018761 A1 Aug. 30, 2001

(30) Foreign Application Priority Data

Feb. 28, 2000 (JP) ........................ 2000-052404
Sep. 11, 2000 (JP) ........................ 2000-274301

(51) Int. Cl.[7] .............................. G06F 17/50
(52) U.S. Cl. ........................................ 716/4
(58) Field of Search ................ 716/2, 4, 10, 14; 331/1; 257/660

(56) References Cited

U.S. PATENT DOCUMENTS 5,639,989 A * 6/1997 Higgins, III ............... 257/660
6,342,823 B1 * 1/2002 Dansky et al. ............. 333/1

FOREIGN PATENT DOCUMENTS

JP 10-049568 2/1998
JP 10-091663 4/1998

* cited by examiner

*Primary Examiner*—Matthew Smith
*Assistant Examiner*—Thuan Do
(74) *Attorney, Agent, or Firm*—Young & Thompson

(57) ABSTRACT

A design assisting system is constructed as a CAD (computer-aided design) system for assisting in designing printed-circuit boards or other electronic devices. The system makes it possible to design layouts for reducing an unwanted electromagnetic radiation due to a common-mode current. The system has a first tool for converting at least a set of an electronic device, an interconnection, and a ground plane from layout information of a circuit board into a model for analyzing an electromagnetic field, a second tool for specifying a frequency and calculating a magnetic field intensity distribution near the ground plane using the model, and a third tool for superposing the calculated magnetic field intensity distribution and the position of the interconnection, determining whether a position where a magnetic field or a current is strong and the position of the interconnection are close to each other or not, and outputting a determined result.

31 Claims, 20 Drawing Sheets

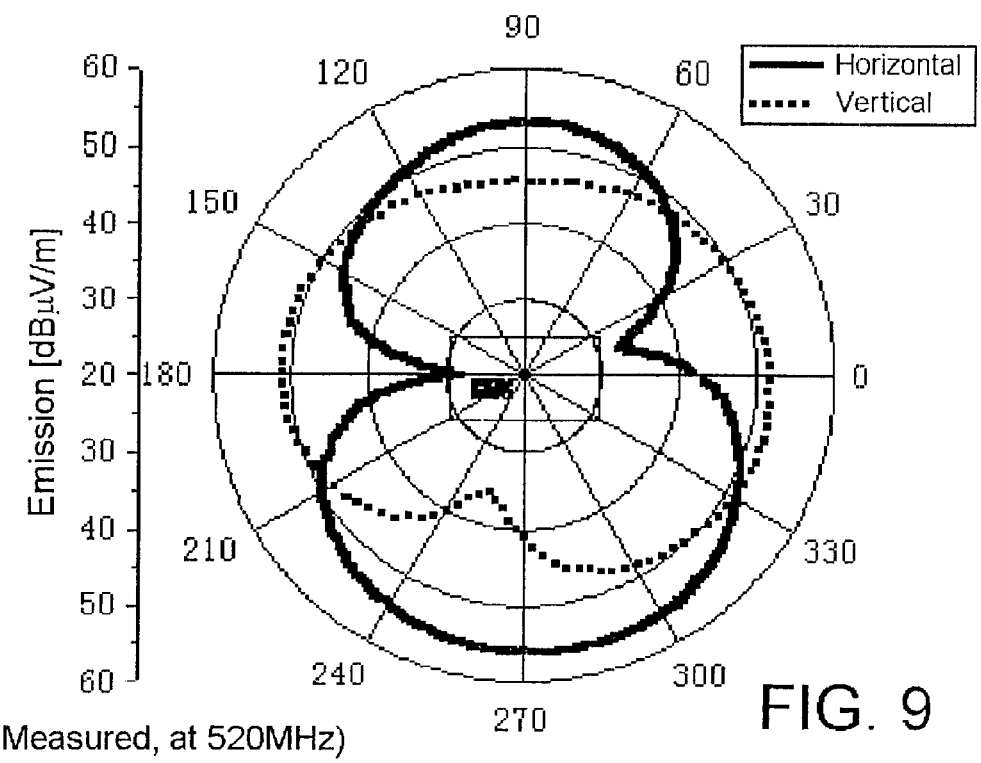
(Measured, at 520MHz) FIG. 9
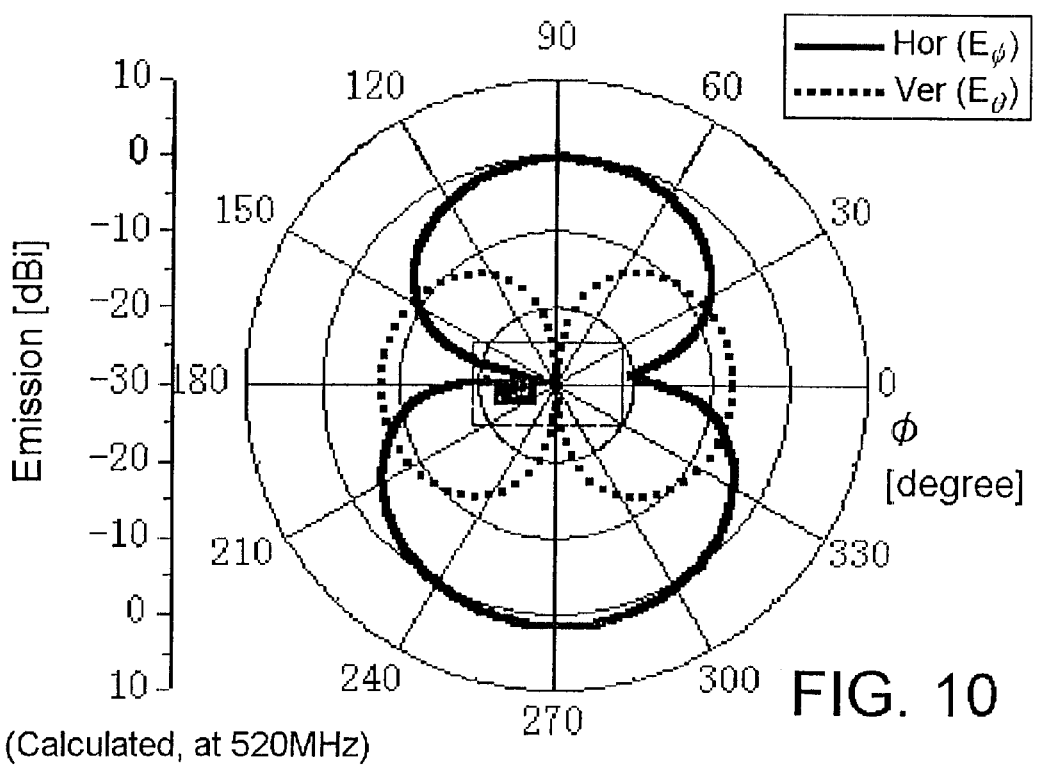
(Calculated, at 520MHz) FIG. 10

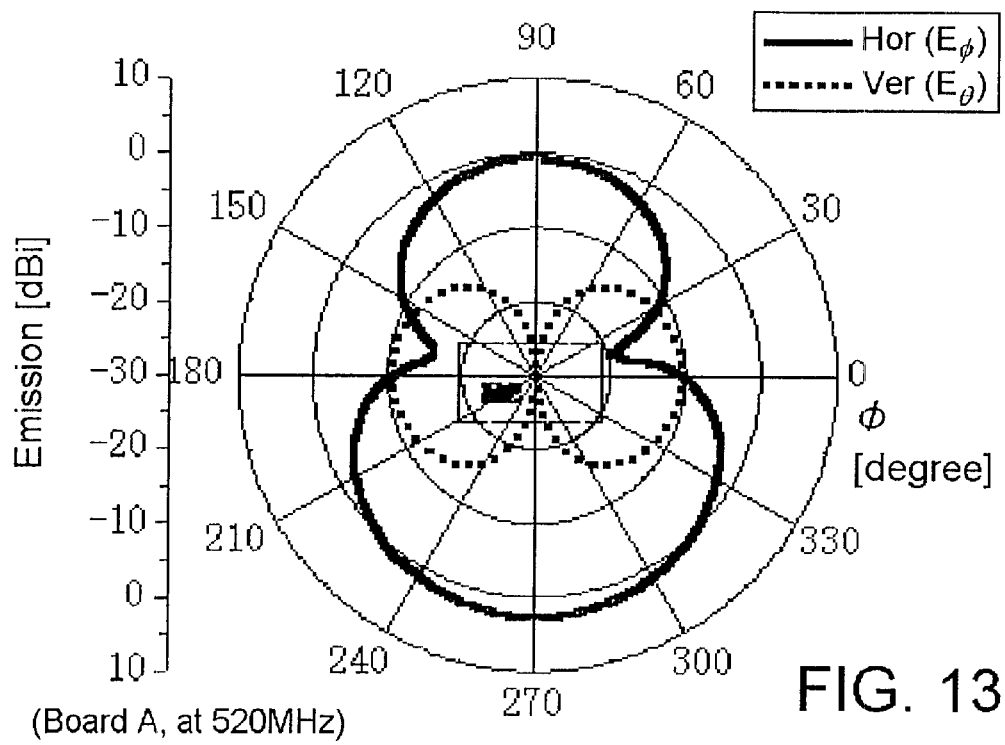
(Board A, at 520MHz) FIG. 13
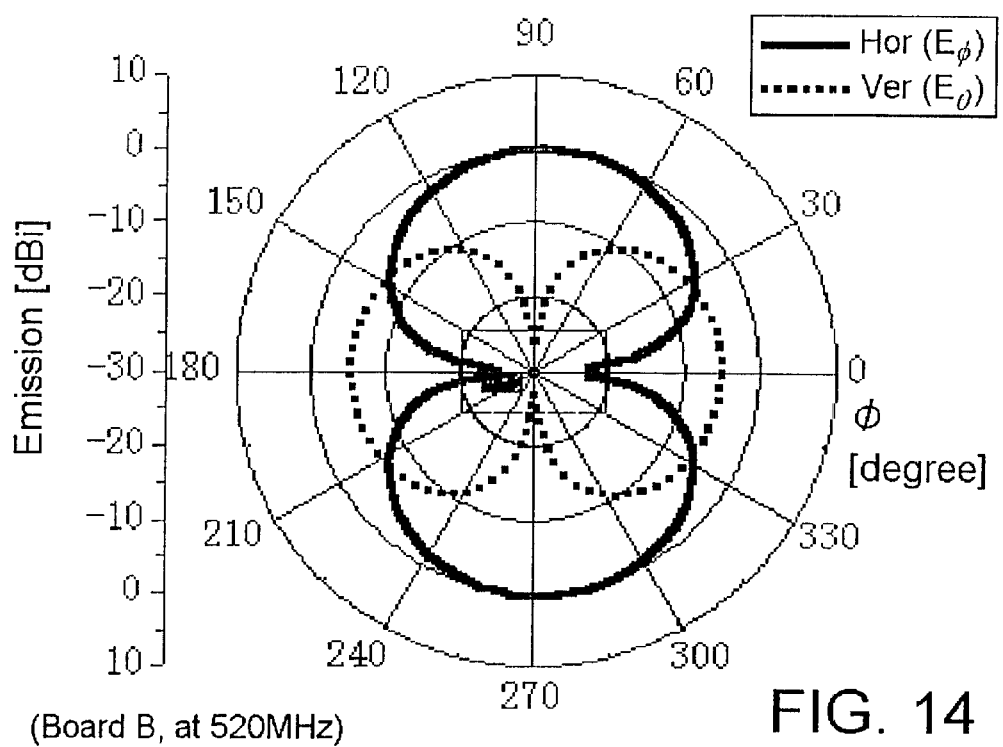
(Board B, at 520MHz) FIG. 14

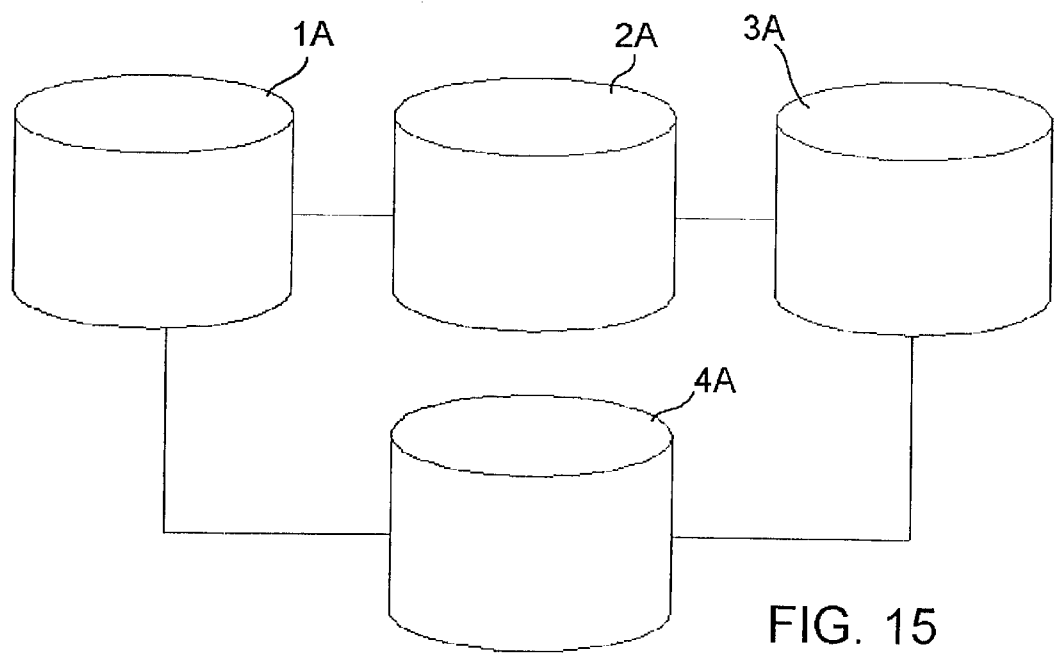
FIG. 15
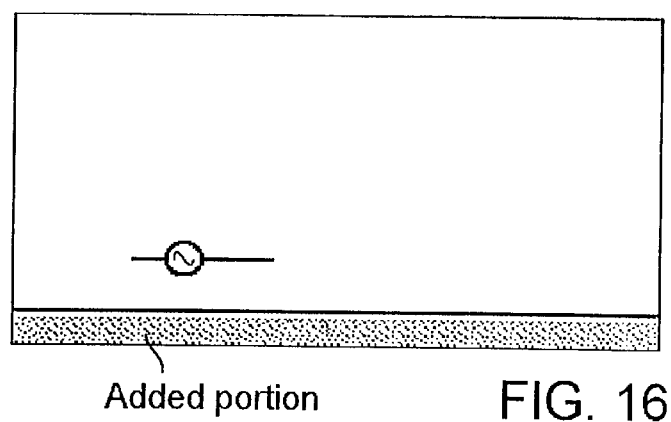
Added portion   FIG. 16

(Calculated, point A, at 220MHz)

(Calculated, point B, at 220MHz)

DESIGN AND ASSISTING SYSTEM AND METHOD USING ELECTROMAGNETIC POSITION

BACKGROUND OF THE INVENTION

1. Field of the Invention

The present invention relates to a design assisting method, a design assisting system, and a design assisting tool for use in designing printed-circuit boards or other electronic devices, and more particularly to a design assisting method and a design assisting system for designing electronic devices with reduced electromagnetic radiations.

2. Description of the Prior Art

It is necessary to design printed-circuit boards and electronic devices with reduced electromagnetic radiations in order to prevent any unwanted electromagnetic radiations from those printed-circuit boards and electronic devices from interfering the reception of broadcasts and communications and also from causing other electronic devices from malfunctioning. However, since it has been customary to design printed-circuit boards and electronic devices based on the experiences and know-hows of circuit designers, it has been difficult for anybody to design products incorporating effective countermeasures against unwanted electromagnetic radiations. In order to solve such a problem, there have been proposed various tools for assisting in designing printed-circuit boards and electronic devices with reduced electromagnetic radiations. For example, the proposals include Japanese laid-open patent application No. 10-049568 (JP, 10049568, A) and Japanese laid-open patent application No. 10-091663 (JP, 091663, A).

FIG. 1 is a flowchart illustrating the method for generating the layout of a printed-circuit board disclosed in JP, 10-049568, A. The disclosed method is based on the idea that the dominant radiation from a printed-circuit board originates from signal lines, and characterized by calculating the amount of radiation from signal lines, providing a countermeasure if the calculated amount of radiation exceeds a certain limit value, and determining an optimum layout for the countermeasure. The disclosed method allows a printed-circuit board to be designed with reduced electromagnetic radiations from the signal lines.

In step S1 shown in FIG. 1, parts layout information indicative of the layout of parts and connection base information indicative of connections between the parts are determined using a conventional CAD (computer-aided design) system or a conventional circuit simulator. In step S2, board data as a basis for determining line constants for signal lines, such as conductor thicknesses, at the time circuits are formed on an actual board, and signal characteristics indicative of the characteristics of signals applied to the signal lines, such as device models representing input and output characteristics of the parts, are entered. A number 1 is set as an initial value for a table number m that is used for referring to a layer structure description table, and a number 1 is specified as an initial value for a cross-section number n in a hypothetical cross-section description table.

In step S3, hypothetical interconnection paths between the parts are calculated from the parts layout information and the connection base information both have been determined in step S1. In step S4, an amount X of unwanted radiation is calculated for each of the determined hypothetical interconnection paths. If the amount X of unwanted radiation is in excess of a preset allowable value A, then, in step S5, noise countermeasures are taken to reduce the amount X to or below the preset allowable value A. The noise countermeasures include two noise countermeasure procedures, i.e., a procedure of improving a hypothetical cross-section to strengthen the ground, and another procedure of inserting a noise countermeasure component such as a capacitor. In step S6, it is determined whether there is a signal line yet to be processed or not. If there is a signal line yet to be processed, then control goes back to step S3 in order to repeat the processing in steps S3 through S5 for that signal line.

In step S7, with respect to all the signal lines whose amount X of unwanted radiation has exceeded the preset allowable value A, improved solution N1 is calculated from the interconnection information with an improved cross-sectional shape, and improved solution N2 is calculated from the interconnection information with an inserted noise countermeasure component. If improved solutions N1, N2 are not particularly distinguished from each other, then they are simply referred to as improved solutions N.

After improved solutions N are determined in step S7, a description table and a described layer structure are assigned to each of improved solutions N. In step S8, it is then reviewed whether each of the layer structures can be practically feasible or not. In step S9, practically feasible solutions P are extracted from the combination of the layer structures and improved solutions N. Specifically, interconnection complexity levels $\alpha$ and variations $\gamma$ of interconnection complexity levels $\alpha$ are calculated with respect to the respective layer structures, and it is determined whether each of the layer structures is practically feasible or not based on whether or not interconnection complexity level $\alpha$ and variation $\gamma$ thereof are equal to or smaller corresponding allowable values B, C. In step S10, optimum solution Q is selected from the collection of calculated practically feasible solutions P by evaluating sum x of amounts X of unwanted radiation and manufacturing cost y. Thereafter, in step S11, signal lines are actually placed on a layer structure determined by selected optimum solution Q. In this manner, interconnections on a printed-wiring board are determined.

FIG. 2 shows a conceptual presentation of operation of the CAD apparatus revealed in JP, 10091663, A. The disclosed CAD apparatus resides in that when a certain interconnection is specified on the CAD apparatus used for designing a printed-circuit board, an amount of radiation from the interconnection is calculated based on signal waveform information of the interconnection, and the intensity of radiation from place to place is visually displayed. The CAD apparatus is capable of identifying the position of a dominant signal interconnection which produces electromagnetic radiation, and hence permits a countermeasure to be easily taken against the radiation from the signal interconnection. The disclosure is characterized in that basic period T, voltage amplitude $V_0$, rise and fall times $t_r$, logic high period $t_0$, and duty ratio $\tau$ $(=(t_r-t_0)/T)$ of the signal waveform can be described, and the printed-circuit board CAD apparatus calculates a current based on these descriptions. In FIG. 2, frames A1, A2, A3, A4, . . . schematically represent the concepts of these quantities and quantities derived therefrom. A trapezoidal signal shown in frame A1 comprises a plurality of harmonics. When the circuit designer observes an n-th harmonic, if observed frequency f is f=n/T as indicated in frame A2, current I(f) can be calculated according to the equations in frames A3, A4.

If it is assumed that the interconnection layer is made of a metal foil having width $\omega$, has interconnection length L, and one mesh used in calculations carried out by the CAD apparatus has area A, then a current density per mesh is expressed by $I(f) \cdot \omega \cdot L/A$. The current density per mesh is calculated for each mesh, and each mesh is grouped into a level depending on the calculated current density, and displayed on the display screen of the CAD apparatus. As indicated by examples in frame A6, the levels are displayed in four or more luminance gradations, colors, or patterns.

In this manner, the CAD apparatus shown in FIG. 2 appropriately displays the concentration of radiation noise in each area, allowing interconnections to be designed according to an interactive editing process.

Unwanted electromagnetic radiation will be described below.

In the technical field of unwanted electromagnetic radiation, high-frequency currents (or radio-frequency currents) are roughly divided into "differential-mode current" and "common-mode current". The "differential-mode current" refers to currents of the same magnitude flowing in opposite directions in a signal interconnection and a ground plane that faces the signal interconnection, and are also called a "loop current". The "common-mode current" refers to a differential current that is generated when a signal interconnection current and a ground plane current are brought out of balance for some reason. A current flowing through a conductor such as an element of a dipole or monopole antenna, i.e., a current that lacks a paired current in the vicinity, is also referred to as a common-mode current.

If the differential-mode current has a small value, then its radiation level causes no problem because currents of the same magnitude and in opposite phase flow in the vicinity of each other and hence electromagnetic fields generated thereby cancel each other. However, the common-mode current brings about a strong radiation even if its value is small because there is no canceling paired current in the vicinity. The differential-mode current can easily be recognized as a current flowing through a signal interconnection. However, it has been impossible so far to recognize where and how the common-mode current flows and to find its value because the cause of the common-mode current is not known. Stated otherwise, the differential-mode radiation can easily be suppressed by the product design and layout, whereas the common-mode radiation is difficult to reduce. Usually, the overall radiation ability of products is considered to be determined by the common-mode radiation.

The techniques disclosed in JP, 10049568, A and JP 10091663, A are primarily aimed at the suppression of a radiation from signal interconnections on printed-circuit boards, and are each concerned with a tool for assisting in designing an electronic device and a printed-circuit board with a suppressed radiation due to a differential-mode current, and a board structure. The disclosed techniques are not directed to the suppression of a radiation due to a common-mode current.

FIG. 3 schematically shows relation between the layout of a printed-circuit board and the flows of high-frequency currents that cause radiations. As shown in FIG. 3, a ground plane and two LSI (large-scale integration) circuits are mounted on a printed-circuit board. A differential-mode current is indicated by the broken-line arrow, and a common-mode current is indicated by the solid-line arrow. The inventions disclosed in the above publications are addressed to a radiation from the differential-mode current that flows through the signal interconnection and the ground plane which are paired.

Our current study has indicated that radiations from electronic devices which incorporate printed-circuit boards are often mainly composed of a radiation produced when the ground plane on the board acts as an antenna and a radiation when a cable connected to the ground plane acts as an antenna, rather than a radiation caused by the differential-mode current. Those radiations are produced by the common-mode current. The conventional procedures and apparatus have been unable to assist in designing electronic devices and printed-circuit boards with a suppressed radiation due to a common-mode current because the behavior of the common-mode current cannot be recognized.

SUMMARY OF THE INVENTION

It is an object of the present invention to provide a design assisting system for designing a printed-circuit board with a reduced common-mode current which would be responsible for an increased electromagnetic radiation, a printed-circuit board to which a cable is connected, and an electronic device.

Another object of the present invention to provide a design assisting method for designing a printed-circuit board with a reduced common-mode current which would be responsible for an increased electromagnetic radiation, a printed-circuit board to which a cable is connected, and an electronic device.

According to an aspect of the present invention, there is provided a design assisting system comprising means for converting at least a set of an electronic device, an interconnection, and a ground plane from layout information of a circuit board into a model for analyzing an electromagnetic field, means for specifying a frequency and calculating a magnetic field intensity distribution near the ground plane using the model, and means for superposing the calculated magnetic field intensity distribution and the position of the interconnection, determining whether a position where a magnetic field or a current is strong and the position of the interconnection are close to each other or not, and outputting a determined result.

According to another aspect of the present invention, there is provided a design assisting system comprising means for converting at least a set of an electronic device, an interconnection, and a ground plane from layout information of a circuit board into a model for analyzing an electromagnetic field, means for entering a an assumed position where a cable is connected, means for specifying a frequency and calculating an electric field intensity distribution near the ground plane using the model, and means for determining whether a position where an electric field is strong and the assumed position are in agreement with each other or not, and outputting a determined result.

According to still another aspect of the present invention, there is provided a design assisting system comprising means for converting at least a set of an electronic device, an interconnection, and a ground plane from layout information of a circuit board into a model for analyzing an electromagnetic field, means for specifying a frequency and calculating an electric field intensity distribution near the ground plane using the model, and means for finding a position whether an electric field is weak as a position suitable for cable connection, and outputting the position.

According to yet another aspect of the present invention, there is provided a design assisting method comprising the steps of converting at least a set of an electronic device, an interconnection, and a ground plane from layout information of a circuit board into a model for analyzing an electromagnetic field, specifying a frequency, calculating a magnetic field intensity distribution near the ground plane using the model at the specified frequency, superposing the calculated magnetic field intensity distribution and the position of the interconnection thereby to determine whether a position where a magnetic filed or a current is strong and the position of the interconnection are close to each other or not, and outputting a determined result.

According to yet still another aspect of the present invention, there is provided a design assisting method comprising the steps of converting at least a set of an electronic device, an interconnection, and a ground plane from layout information of a circuit board into a model for analyzing an electromagnetic field, entering an assumed position where a cable is connected, specifying a frequency, calculating an electric field intensity distribution near the ground plane using the model at the specified frequency, determining whether a position where an electric field is strong and the assumed position are in agreement with each other or not, and outputting a determined result.

According to a further aspect of the present invention, there is provided a design assisting method comprising the steps of converting at least a set of an electronic device, an interconnection, and a ground plane from layout information of a circuit board into a model for analyzing an electromagnetic field, specifying a frequency, calculating an electric field intensity distribution near the ground plane using the model at the specified frequency, and finding a position whether an electric field is weak as a position suitable for cable connection based on the electric field intensity distribution.

The present invention also provides a computer-readable medium storing a program enabling a computer to perform each process of the above design assisting methods.

With the above arrangement, there is realized a design assisting system capable of suppressing a radiation due to a common-mode current. Since a factor, i.e., a magnetic field intensity distribution or an electric field intensity distribution in the vicinity of a ground plane, for determining a radiation due to a common-mode current is clarified, it is possible to assist designs and modifications of printed circuit boards or electronic devices once points to be checked are clarified according to the present invention. Furthermore, because minimum elements required by an electromagnetic field analyzing model for finding the factor for determining a radiation due to a common-mode current, and procedures for laying out those elements are also clarified, it is possible to obtain information required by designs in a short period of time according to the present invention. For designing a printed-circuit board, it may be sufficiently advantageous in certain situations to obtain information that is 50% accurate in one minute, rather than to obtain information that is 90% accurate in one week. The design assisting system and method according to the present invention are effective as a design assisting tool in such an application.

The above and other objects, features, and advantages of the present invention will become apparent from the following description with reference to the accompanying drawings which illustrate examples of the present invention.

BRIEF DESCRIPTION OF THE DRAWINGS

FIG. 9 is a graph showing the measured result of a radiation pattern;

FIG. 10 is a graph showing the calculated result of a radiation pattern by a method according to the present invention;

FIG. 13 is a graph showing a radiation pattern of the substrate A;

FIG. 14 is a graph showing a radiation pattern of the substrate B;

FIG. 15 is a block diagram showing a design assisting system according to a second embodiment of the present invention;

FIG. 16 is a plan view showing a modified ground plane;

DESCRIPTION OF THE PREFERRED EMBODIMENTS

A design assisting system for use in designing a printed-circuit board where a common-mode current is difficult to flow, based on the principles of the present invention, will first be described below.

Figure 1:
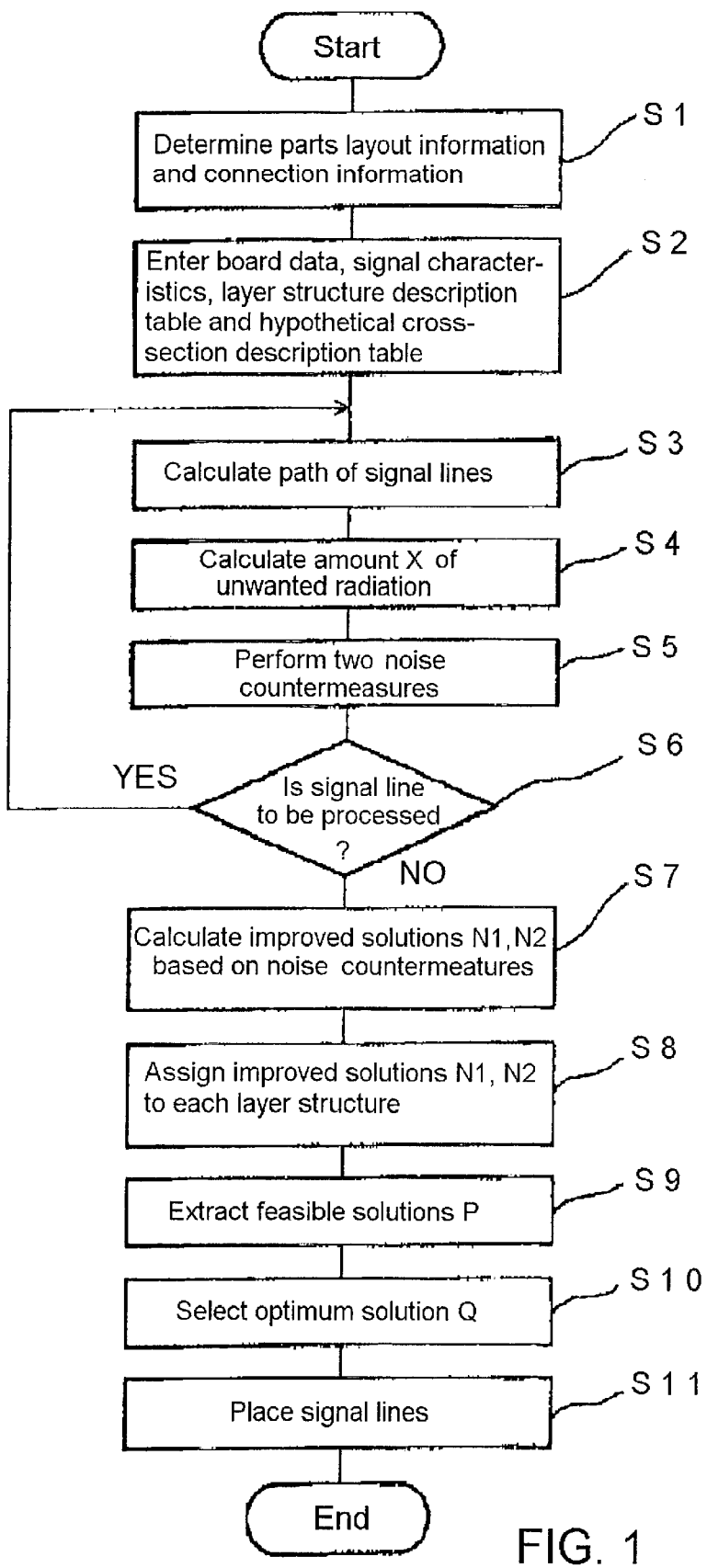
FIG. 1 is a flowchart illustrating a conventional method of designing a printed-circuit board.
Figure 2:
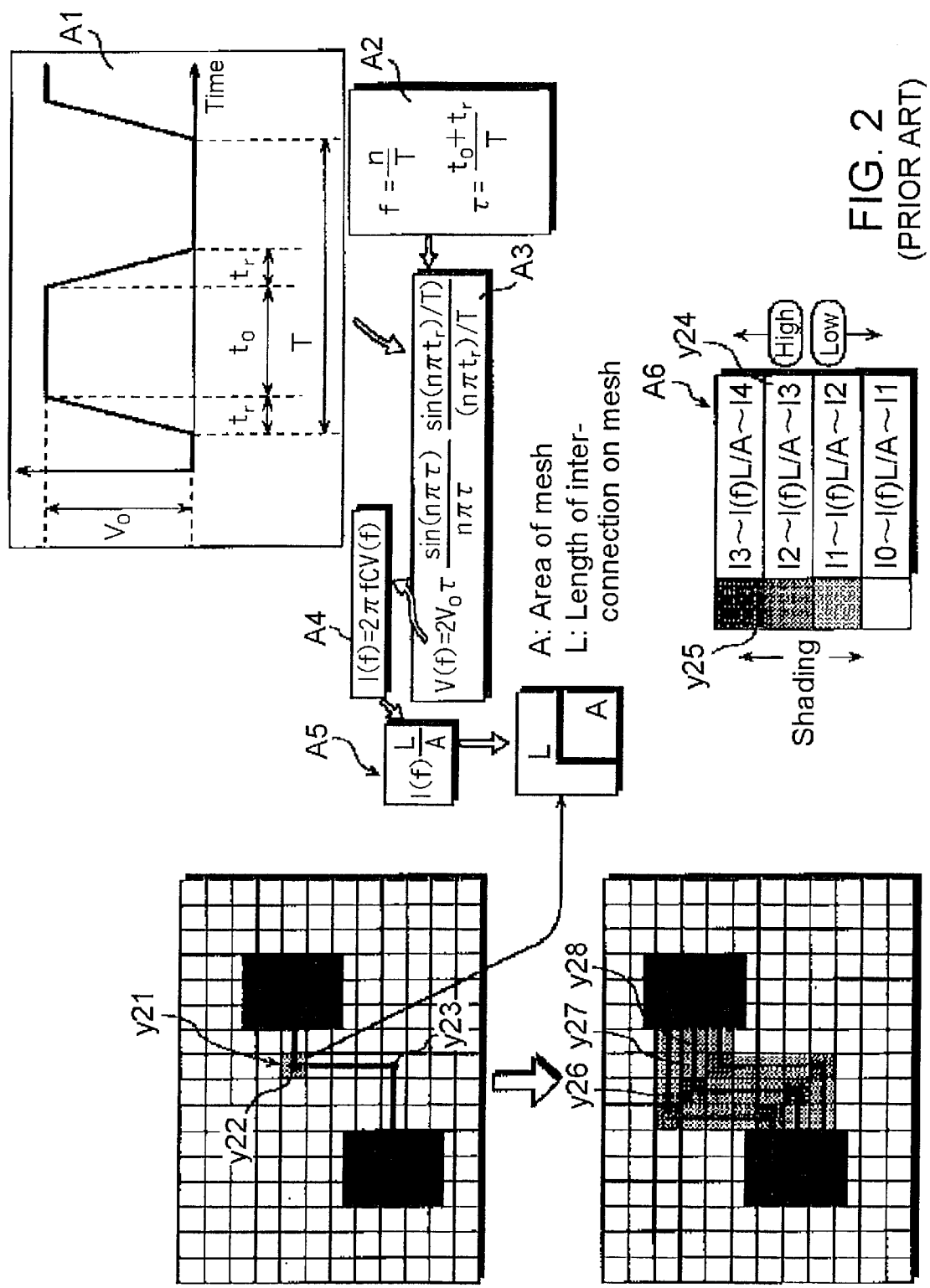
FIG. 2 is a diagram of a conceptual presentation of operation of a conventional CAD system.
Figure 3:
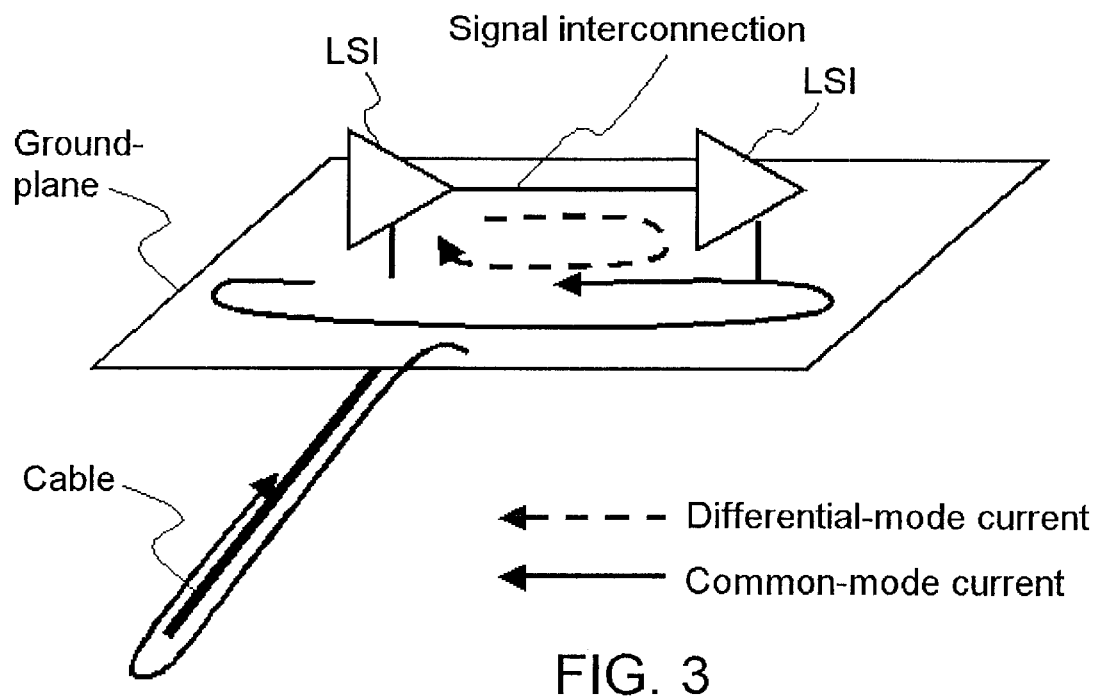
FIG. 3 is a diagram illustrative of a differential-mode current and a common-mode current.
Figure 4:
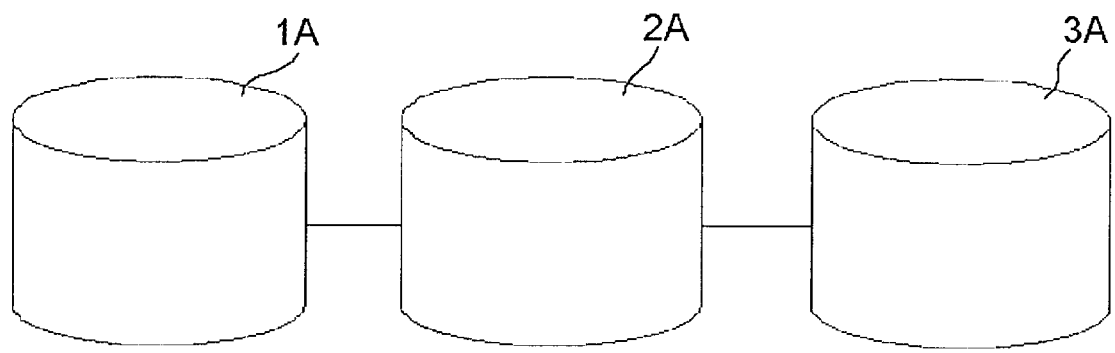
FIG. 4 is a block diagram showing a design assisting system according to a first embodiment of the present invention.

A design assisting system according to a first embodiment of the present invention shown in FIG. 4 comprises a combination of three tools 1A, 2A, 3A. Tool 1A serves to generate a model for analyzing an electromagnetic field from the layout information of a printed-circuit board. Tool 2A serves to calculate a magnetic field intensity distribution in the vicinity of the ground plane of the printed-circuit board when frequencies are specified. Tool 3A serves to determine whether a position where a magnetic field is strong is close to the position of an interconnection or not, based on the relationship between the magnetic field intensity distribution and the board layout, and outputting the determined result. The tools may comprise a software or hardware arrangement for performing a certain process. In the present invention, the tools specifically refer to a group of hardware or software for executing a certain process in a CAD apparatus.

Basic operation of each of tools 1A, 2A, 3A will be described below.

Tool 1A selects, among substrate layout information, a ground plane and a region which tends to excite the ground plane and employs the selected ground plane and selected region as a model for analyzing an electromagnetic field. The region which tends to excite the ground plane includes a high-speed clock interconnection, a signal interconnection where a rise time or fall time of signals is short, signal interconnections where simultaneously operating signals are transmitted parallel to each other, a power supply or ground interconnection connected to a high-speed LSI circuit, and an electronic device connected to these interconnections. In this embodiment, at least these excitation sources and the ground plane are employed as a model for analyzing an electromagnetic field. For an increased calculation accuracy, a dielectric material of the board and a power supply plane may also be added to the model.

For tool 2A, frequencies are specified, i.e., the frequencies of harmonics of a signal in the model interconnection, are specified. If the number of frequencies is to be reduced, then some of the harmonic frequencies are selected so that the length of the longer or shorter side of the ground plane is nearly equal to an integral multiple of the half wavelength of each selected frequency. Then, tool 2A calculates a magnetic field intensity distribution in the vicinity of the ground plane, using the model generated by tool 1A. Since the magnetic field on the surface of the ground plane where there is an interconnection is mostly a magnetic field due to a differential-mode current flowing through the interconnection and the ground plane which are paired, almost no magnetic field caused by a common-mode current flowing through the ground plane can be observed. Therefore, it is desirable to calculate a magnetic field on the reverse side of the ground plane which is not affected by the differential-mode current.

Tool 3A compares a position where the magnetic field is strong and the position of an interconnection with each other based on the positional relationship of the magnetic field intensity distribution in the vicinity of the ground plane to the printed-circuit board. As the position where the magnetic field is strong and the position of the interconnection are closer to each other, the common-mode current is more liable to flow through the ground plane. Therefore, it is determined whether the interconnection tends to excite the ground plane or not by using the distance from the position where the magnetic field is maximum to the interconnection as a parameter, checking whether the position where the magnetic field is maximum is present within radius R from the interconnection or not, or checking whether the magnetic field intensity within radius R is in excess of a certain limit value or not. Tool 3A thus outputs the determined result visually or as an alternative choice between "NG" and "OK" or an alternative choice between "1" and "0".

Figure 5A:
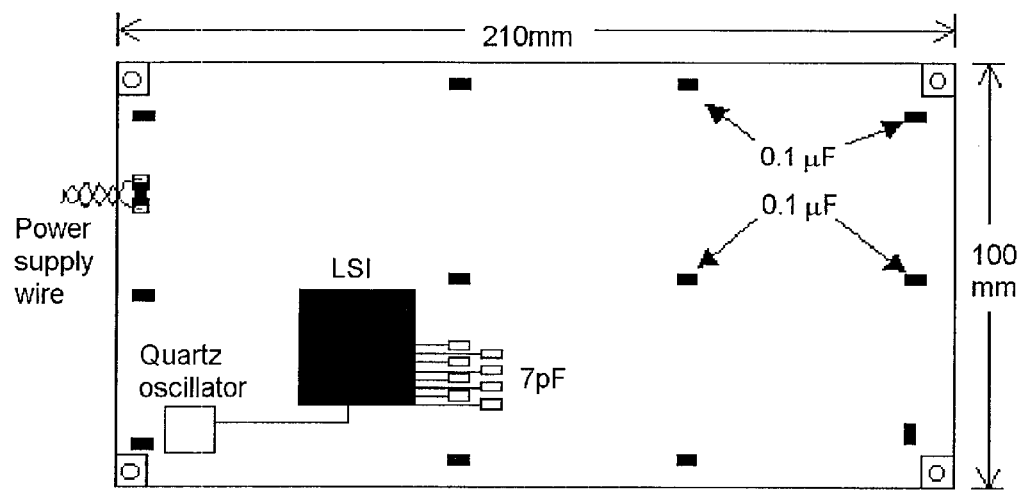
FIGS. 5A and 5B are plan and cross-sectional views, respectively, of a printed-circuit board used in the first embodiment of the present invention.
Figure 5B:
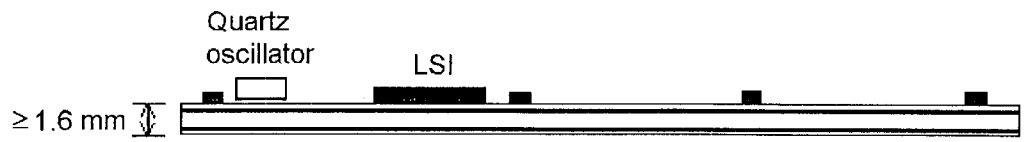

The first embodiment will be described in greater detail with respect to an example in which a printed-circuit board is actually designed. FIGS. 5A and 5B show a printed-circuit board used in the first embodiment. The printed-circuit board has a size of 210 mm×100 mm×1.6 mm, and uses a glass fabric base-epoxy resin laminate as a base material. The printed-circuit board comprises a four-layered board including a signal layer, a ground layer, a power supply layer, and another signal layer successively arranged, as first through fourth layers, in the order named from above. The first layer supports thereon a quartz crystal oscillator, an LSI circuit, signal interconnections, load capacitors each of 7 pF, and a decoupling capacitor of 0.1 μF. The signal interconnection from the LSI circuit to the load capacitor has a length of about 10 mm. The second and third layers comprise a ground plane and a power supply plane, respectively, which cover the board in its entirety. The fourth layer supports no parts and no interconnections. A rectangular-wave signal of 40 MHz outputted from the quartz crystal oscillator is applied to the LSI circuit, which converts the rectangular-wave signal into a rectangular-wave signal of 20 MHz. Signals from the LSI circuit are outputted to 16 signal interconnections each connected to the load capacitor of 7 pF.

Figure 6A:
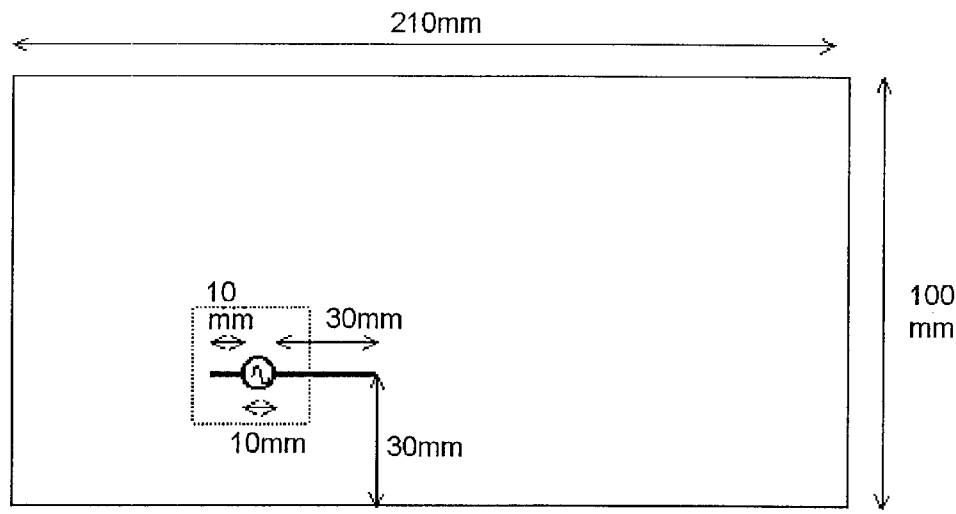
FIGS. 6A and 6B are plan and side elevational views, respectively, of a model for analyzing an electromagnetic field acting on the printed-circuit board shown in FIGS. 5A and 5B.
Figure 6B:
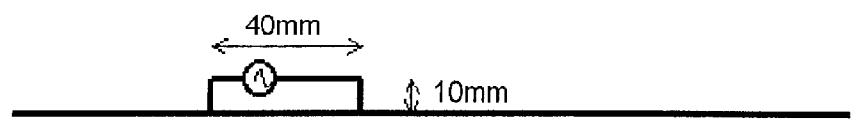

The tool 1A generates a model for analyzing an electromagnetic field with respect to the printed-circuit board shown in FIG. 5. FIGS. 6A and 6B show, in plan and side elevation, respectively, the generated model.

On the printed-circuit board, the 16 signal interconnections that extend parallel to each other operate simultaneously are considered to be mainly responsible for exciting the ground plane. In the model, the 16 signal interconnections are modeled as a single metal wire. The transmitting LSI circuit connected to these signal interconnections has a chip modeled as a voltage source and a frame modeled as a metal wire. Each load capacitor of 7 pF is also modeled as a metal wire on the assumption that it is essentially short-circuited at high frequencies. The ground plane is modeled as a metal plane of the same size. Each of the metal wire and the metal plane is modeled as a complete conductor whose thickness is infinitely small. However, each of the metal wire and the metal plane is not limited to a complete conductor whose thickness is infinitely small, but may be modeled as a metal wire or a metal plane having a finite thickness. The printed-circuit board also includes a dielectric layer disposed between conductive layers and the power supply plane. However, the dielectric layer is ignored as it is sufficiently thin, and the power supply plane is also ignored as it is subject to an induction from the ground plane and acts as an antenna which is the same as the ground plane. While the dielectric layer and the power supply plane may be modeled, the time required to make calculations would be increased due to these models.

For analyzing an electromagnetic field, an FDTD (finite-difference time-domain) method is used. This analyzing method defines a certain analytic space, divides the analytic space into small cells, and sequentially calculates a time-dependent change in the electromagnetic field in each of the cells. The analyzing method is suitable for calculating an electromagnetic radiation from an antenna placed in a space, a scattering of a substance, and an electromagnetic field intensity distribution in the vicinity of a metal plane.

Figure 7:
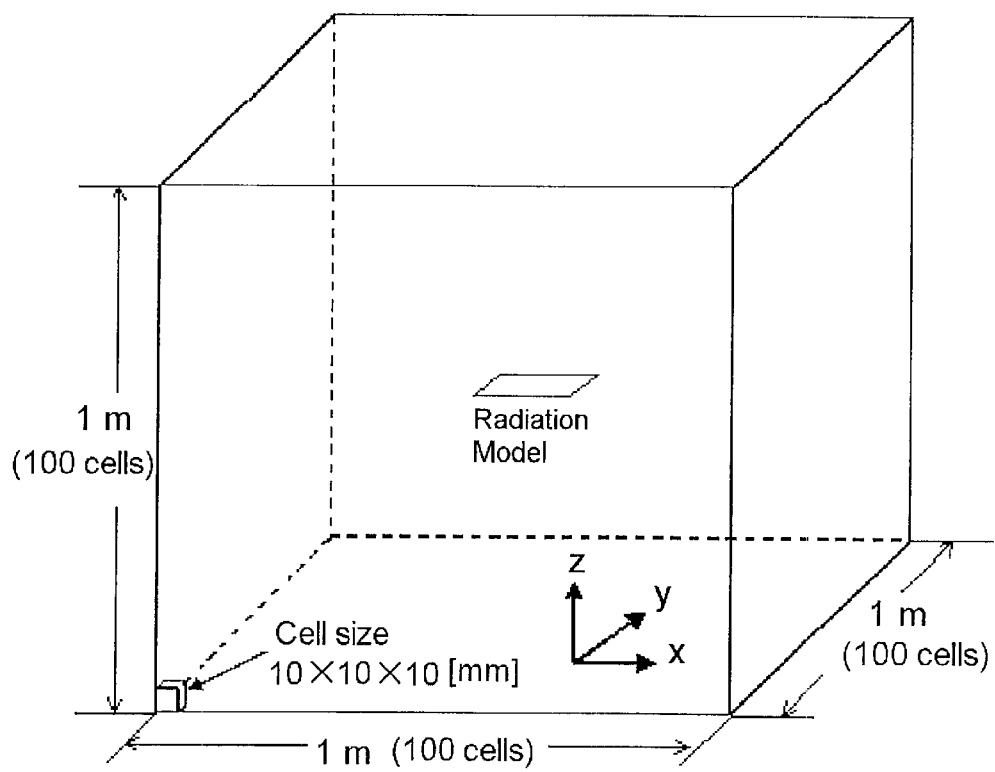
FIG. 7 is a perspective view of an electromagnetic field analytic space.

FIG. 7 shows an analytic space that is used here. The analytic space is in the form of a cube and has a size of 1 m×1 m×1 m, and absorbing boundary conditions, called Mur's second order absorbing boundary conditions, are applied to the outer peripheral surfaces of the three-dimensional analytic space. The analytic space is divided into one million cubic cells each having a size of 10 mm×10 mm×10 mm. The substrate model is placed at the center of the analytic space. The metal wires of signal interconnections and lead frames are modeled using sides of cubic cells. The metal plane is modeled using side faces of cubic cells. The voltage source is placed on a side of a cubic cell.

Using the model generated by tool 1A, and defining the above analytic space, tool 2A calculates a magnetic field in the vicinity of the ground plane. For calculating such a magnetic field in the vicinity of the ground plane, a frequency is first specified. Specifically, a frequency of 520 MHz, which is the frequency of a harmonic of the rectangular-wave signal of 20 MHz and whose half wavelength is substantially the same as the length of the longer side of the ground plane, is selected. Tool 2A determines a magnetic field distribution in the vicinity of the ground plane with respect to the selected frequency. In order to avoid the effect of a differential-mode current between the interconnection and the ground plane, a magnetic field distribution within a plane which is 10 mm spaced from the reverse side of the ground plane is calculated.

Figure 8:
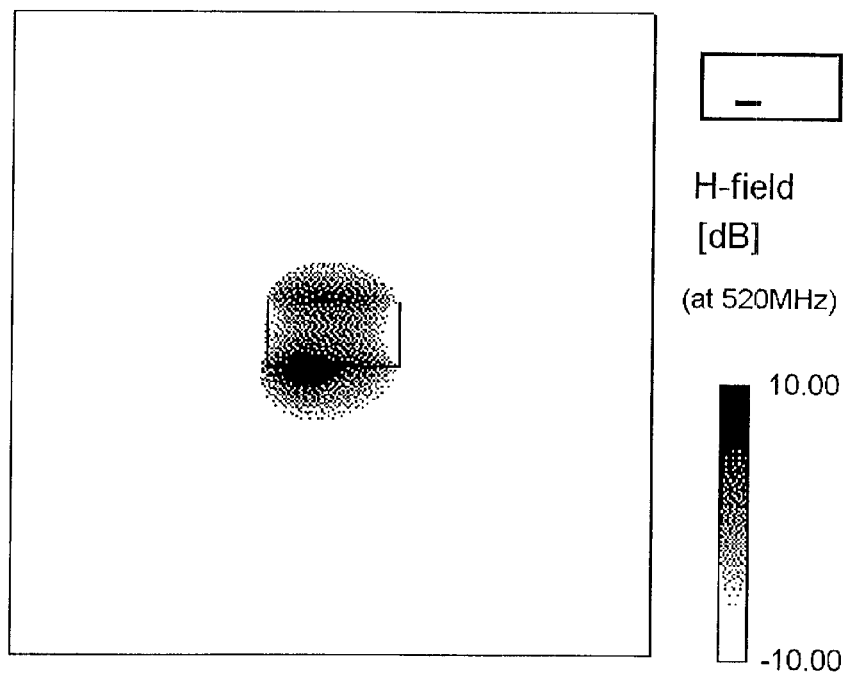
FIG. 8 is a plan view showing a magnetic field intensity distribution in the vicinity of a ground plane.

Then, tool 3A compares the magnetic field distribution and the position of the interconnection with each other. FIG. 8 shows in plan a magnetic field distribution of a 520 MHz component and the board layout in a superposed representation, and indicates that the magnetic field is stronger as the color is darker. It can be seen from FIG. 8 that there is a point of a strong magnetic field on an edge of the ground plane near the interconnection. As the point of a strong magnetic field is closer to the interconnection, the common-mode current is more liable to flow in the ground plane. Using the distance from the position where the magnetic field is maximum to the interconnection as a parameter, tool 3A determines whether the parameter is in excess of certain limit value X or not, or whether the position where the magnetic field is maximum is present within radius R from the interconnection or not, or whether the magnetic field intensity within radius R is in excess of certain limit value Y or not. In this manner, tool 3A determines whether the interconnection is easy to pass the common-mode current through the ground plane or not.

Then, tool 3A outputs the determined result visually as shown in FIG. 8 or as a symbol "NG"/"OK" or "1"/"0".

In the first embodiment, as described above, the design assisting system is capable of easily determining whether a given interconnection is easy to pass the common-mode current through the ground plane or not, i.e., whether a given interconnection is liable to become an unwanted radiation source or not, and hence assisting in designing a printed-circuit board with reduced unwanted radiation.

The validity of the modeling process carried out by tool 1A will be reviewed by comparing measured and calculated results with each other. FIG. 9 is a graph showing a radiation pattern at the frequency 520 MHz from the printed-circuit board shown in FIGS. 5A and 5B which is actually fabricated and operated. The radiation pattern is measured in the unit of electric field intensity dBµV/m. FIG. 10 is a graph showing a radiation pattern based on the calculated result according to the first embodiment. The radiation pattern is measured in the unit of absolute gain dBi. In FIGS. 9 and 10, the radiation patterns are shown in the board plane, and the solid-line curve indicates a horizontally polarized component and the dotted-line curve a vertically polarized component.

Though expressed in the different units, the radiation patterns shown in FIGS. 9 and 10 which are in the $E_\phi$ direction of the principal polarization were qualitatively in agreement with each other. At other frequencies and other observation planes, the radiation patterns of the principal polarization were also qualitatively in agreement with each other. It was confirmed from the above results that an electromagnetic field around a printed-circuit board can be calculated based on a model generated by the tool 1A.

The reason why the positional relationship between the magnetic field in the vicinity of the ground plane and the interconnection can be used as a basis for determining whether the common-mode current is liable to flow through the ground plane or not will be described below.

Figure 11:
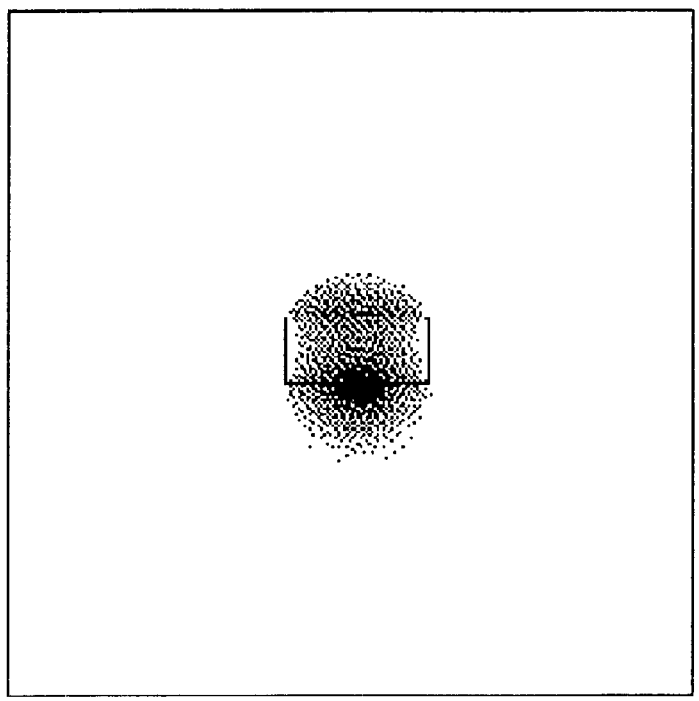
FIG. 11 is a plan view showing a magnetic field intensity distribution on substrate A.
Figure 12:
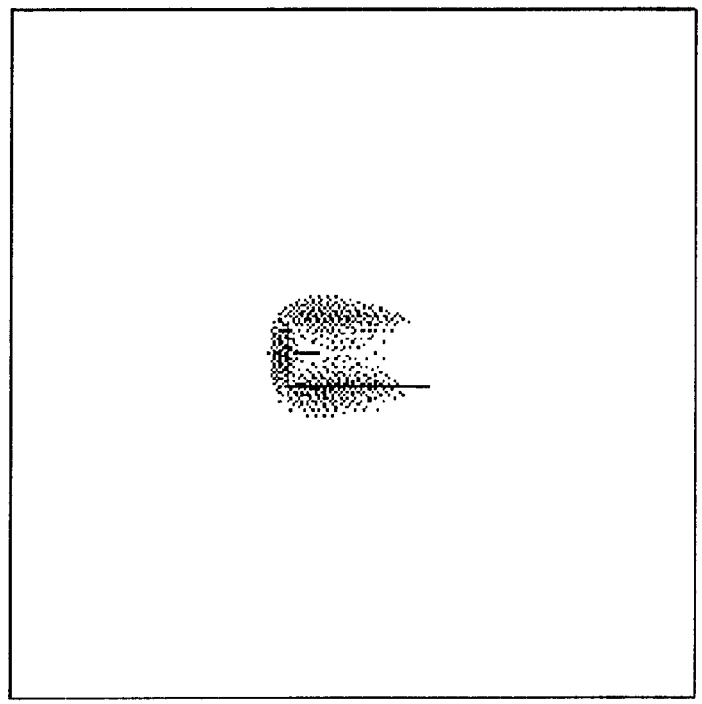
FIG. 12 is a plan view showing a magnetic field intensity distribution on substrate B.

FIGS. 11 and 12 show magnetic field distributions produced when the interconnection and the voltage source are changed in position while the size of the ground plane, the length of the interconnection, and the magnitude of the voltage source remain the same. FIG. 11 shows a magnetic field distribution produced when the interconnection is positioned beneath the center of the board. FIG. 12 shows a magnetic field distribution produced when the interconnection is positioned along the central axis of the left end of the board. The board where the interconnection is positioned beneath the center of the board will be referred to as board A, and the board where the interconnection is positioned along the central axis of the left end of the board will be referred to as board B.

On board A, as shown in FIG. 11, the maximum magnetic field point on the ground plane and the interconnection position are very close to each other, and the magnetic field at the maximum magnetic field point is strong. On board B, as shown in FIG. 12, the maximum magnetic field point and the interconnection position are spaced from each other, and the magnetic field at the maximum magnetic field point is weak. Since the magnetic field and the common-mode current flowing through the ground plane are in a one-to-one correspondence, the common-mode current flows more strongly in board A than in board B. The radiation pattern of board A is shown in FIG. 13, and the radiation pattern of board B is shown in FIG. 14. Both the radiation patterns have maximum peaks near φ=90°, 270°, and their levels are higher on board A.

It has been confirmed from the above results that as the interconnection and the position where the magnetic field is strong are positioned closer to each other, the common-mode current is more liable to flow through the ground plane and the radiation level is higher due to the common-mode current.

According to the first embodiment, as described above, based on the relationship between the position of the interconnection and the magnetic field intensity near the ground plane, it is possible to determine whether the interconnection causes the common-mode current to flow easily in the ground plane or not, and hence to assist in designing a printed-circuit board where a common-mode current is difficult to flow.

Design assisting systems according to other embodiments of the present invention, based on the design assisting system according to the first embodiment, will be described below.

FIG. 15 shows a design assisting system according to a second embodiment of the present invention. The design assisting system according to the second embodiment is a combination of the design assisting system according to the first embodiment and another tool 4A. Tool 4A serves to change the layout of a board if the position of an interconnection is judged as inappropriate by the tool 3A. Specifically, tool 4A is effective to change the interconnection position from board A shown in FIG. 11 to board B shown in FIG. 12, widen the ground plane region along the interconnection, as shown in FIG. 16, insert a filter in the interconnection, shield the interconnection, or place a magnetic sheet at the position where the magnetic field is strong.

With tool 4A, or a board layout changing means, being added, the design assisting system is capable of assisting in designing an optimum layout for a printed-circuit board while checking whether the layout is of a design where the common-mode current is difficult to flow.

Figure 17:
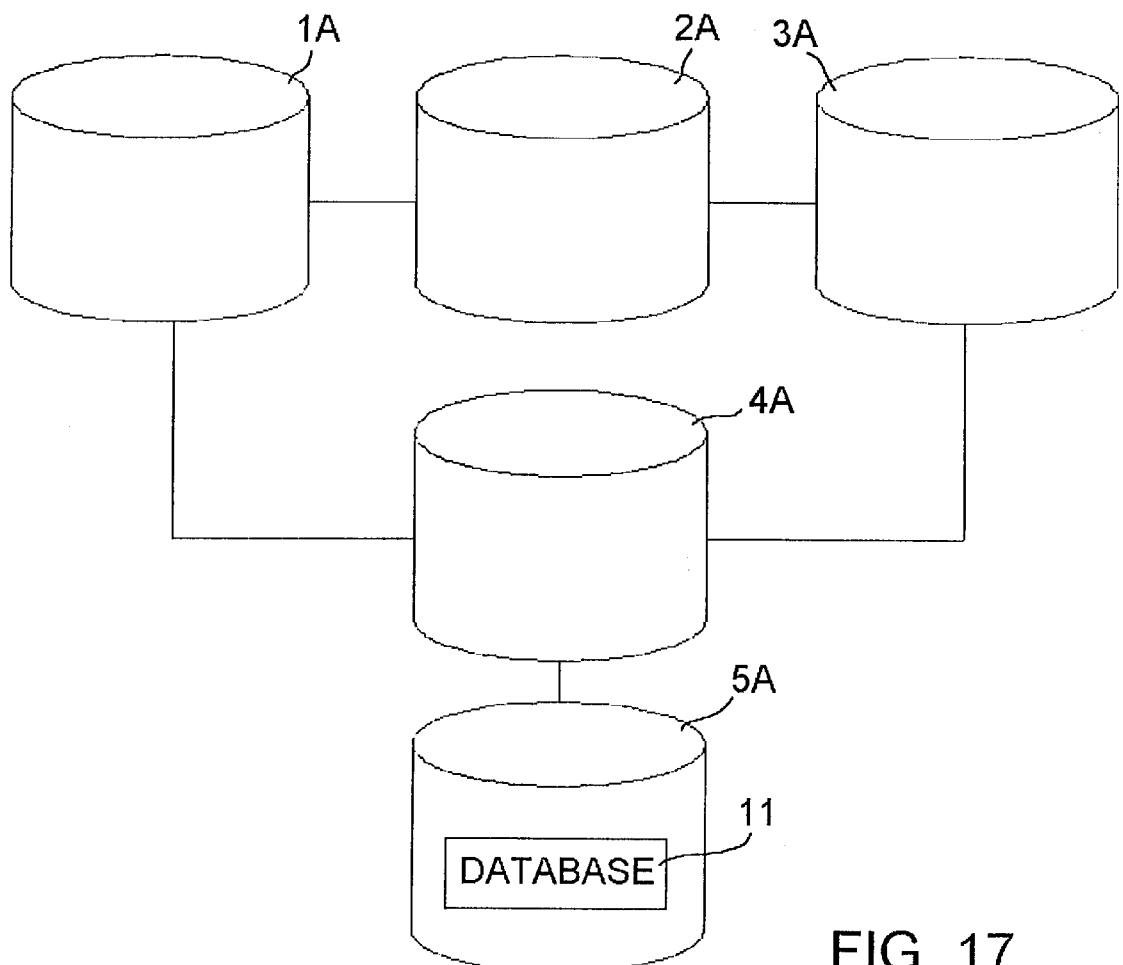
FIG. 17 is a block diagram showing a design assisting system according to a third embodiment of the present invention.

FIG. 17 shows a design assisting system according to a third embodiment of the present invention. The design assisting system according to the third embodiment is a combination of the design assisting system according to the second embodiment and tool 5A for storing database 11 of changes that can be made by tool 4A or the board layout changing means.

Figure 18:
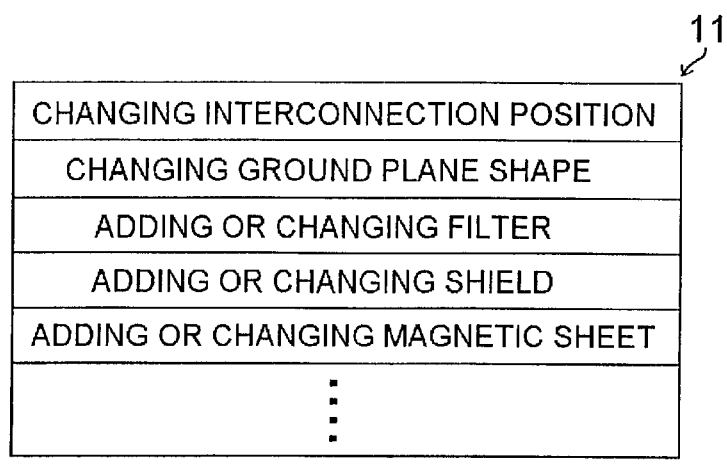
FIG. 18 is a diagram showing the structure of a database provided in the design assisting system shown in FIG. 17.

As shown in FIG. 18, tool 5A stores database 11 having a list of items representing changes that can be made, and serves to support tool 4A in changing the board layout. For example, the items in database 11 include "CHANGING INTERCONNECTION POSITION", "CHANGING GROUND PLANE SHAPE", "ADDING OR CHANGING FILTER", "ADDING OR CHANGING SHIELD", "ADDING OR CHANGING MAGNETIC SHEET", etc. Tool 5A also stores information indicative of an interconnection inhibit zone that is X mm wide from a board edge in relation to the item "CHANGING INTERCONNECTION POSITION", information indicative of the addition of a ground region to space the interconnection X mm from a board edge in relation to the item "CHANGING GROUND PLANE SHAPE", information on an electric constant of a filter component to be added to the interconnection in relation to the item "ADDING OR CHANGING FILTER", information on a basic shape of a shield to be applied to the interconnection in relation to the item "ADDING OR CHANGING SHIELD", and information on the type and electromagnetic constant of a magnetic sheet in relation to the item "ADDING OR CHANGING MAGNETIC SHEET". With database 11 prepared in advance by a circuit engineer who is skilled in designing printed-circuit boards, an engineer who is not so skilled in designing printed-circuit boards can design printed-circuit boards in the same manner as the skilled engineer, using database 11 of the tool 5A. According to the third embodiment, therefore, unskilled engineers can design optimum printed-circuit boards in a short period of time in the same manner as skilled engineers, based on database 11 which includes layout changes that can be made.

A design assisting system for use in designing an electronic device which comprises a printed-circuit board and a cable, based on the principles of the present invention, will be described below.

Figure 19:
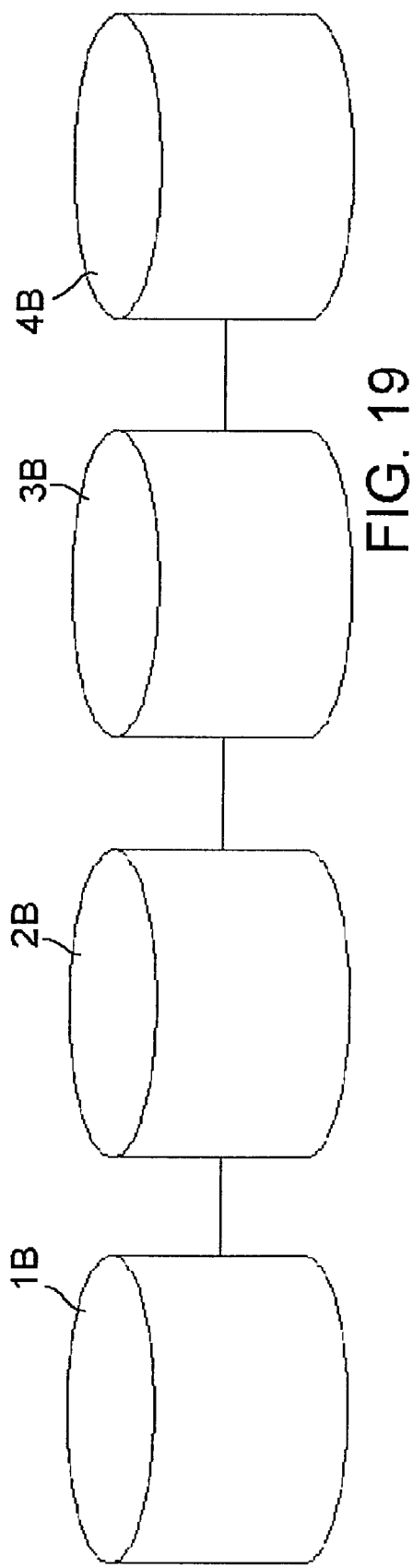
FIG. 19 is a block diagram showing a design assisting system according to a fourth embodiment of the present invention.

A design assisting system according to a fourth embodiment of the present invention shown in FIG. 19 comprises tool 1B for generating a model for analyzing an electromagnetic field from the layout information of a printed-circuit board, tool 2B for entering an assumed position where a cable is connected, tool 3B for specifying a frequency and calculating an electric field intensity distribution in the vicinity of the ground plane of the printed-circuit board, and tool 4B for determining the intensity of an electric field at the assumed position and outputting the determined result.

Tool 1B is the same as tool 1A of the design assisting systems according to the first through third embodiments, selects, among substrate layout information, a ground plane, an interconnection which tends to excite the ground plane and an electronic device connected to the interconnection, and employs the selected ground plane, selected interconnection and selected electronic device as a model for analyzing an electromagnetic field. While at least these components are employed as a model for analyzing an electromagnetic field, a dielectric material of the board and a power supply plane may also be added to the model for an increased calculation accuracy.

Figure 20:
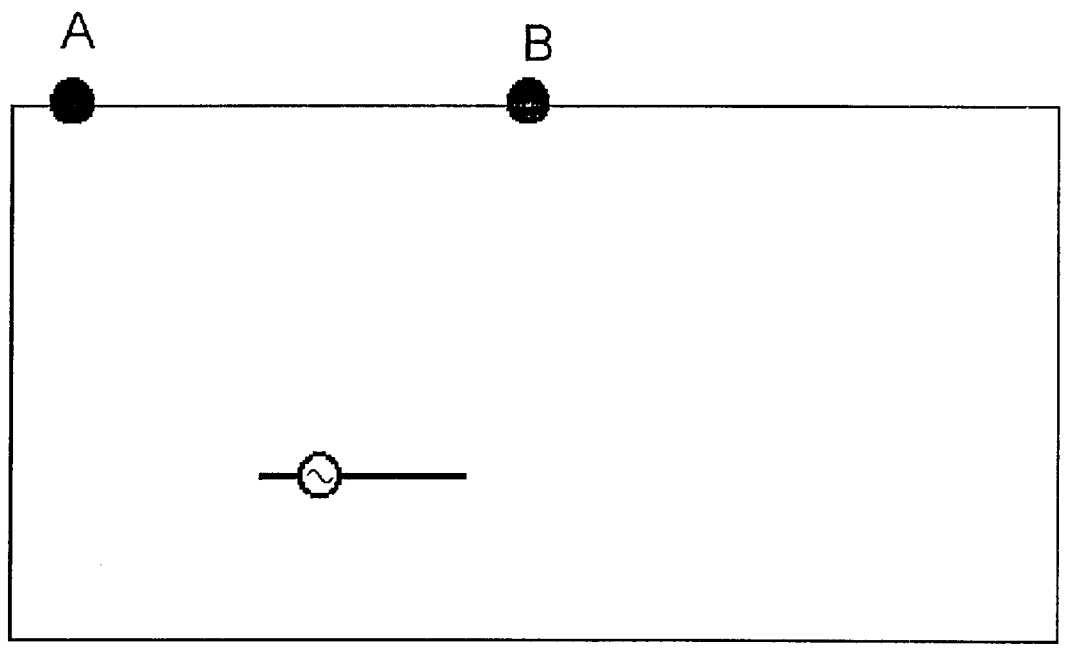
FIG. 20 is a plan view showing an example in which an assumed position where a cable is connected is specified.

Tool 2B serves to enter information indicative of the position on the printed-circuit board to which the cable is to be connected, against the board layout. FIG. 20 shows two assumed positions A, B plotted as solid dots where a cable can be connected, on the layout of the printed-circuit board.

For tool 3B, frequencies are specified, i.e., the frequencies of harmonics of a signal in the model interconnection, are specified. If the number of frequencies is to be reduced, then some of the harmonic frequencies are selected so that the length of the longer or shorter side of the ground plane is nearly equal to an integral multiple of the half wavelength of each selected frequency. Alternatively, some of the harmonic frequencies are selected so that the length of the cable is nearly equal to an integral multiple of the quarter wavelength of each selected frequency.

Then, tool 3B calculates an electric field intensity distribution in the vicinity of the ground plane, using the model generated by tool 1B. Whereas the magnetic field intensity distribution is calculated in the first through third embodiments, the electric field intensity distribution is calculated in the fourth embodiment. A place which is not affected by an electric field produced by a differential-mode current flowing as a pair through the interconnection and the ground plane, but is capable of observing only an electric field produced by a common-mode current is selected as an observation plane. In this embodiment, an electric field distribution on the reverse side of the ground plane is calculated.

Figure 21:
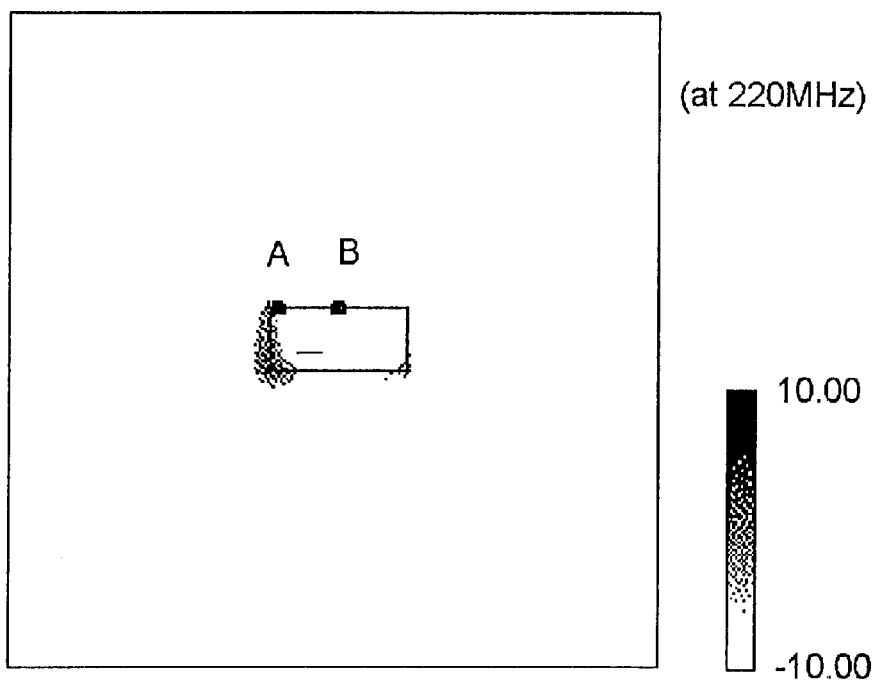
FIG. 21 is a plan view showing an electric field intensity distribution in the vicinity of a ground plane.

After the electric field distribution is calculated, tool 4B determines the intensity of the electric field at the assumed position, which is calculated by tool 3B. Tool 4B may determine the intensity of the electric field based on whether the electric field intensity at the assumed position is in excess of a certain limit value or not, or based on a maximum value or a minimum value of the electric field intensity. Thereafter, tool 4B outputs the determined intensity. Tool 4B may visually display the electric field intensity distribution, the board layout, and the assumed position on plane, or may output the electric field intensity at the assumed position as a symbol "NG"/"OK" or "1"/"0". FIG. 21 shows an electric field intensity distribution calculated with respect to the printed-circuit board shown in FIGS. 5A and 5B and displayed together with the board layout and assumed positions where a cable can be connected. The frequency which is selected is 220 MHz that makes a cable length of 34 cm one quarter of the wavelength. The observation plane is spaced 10 mm from the reverse side of the ground plane. In FIG. 21, as the color is darker, the electric field is stronger, with levels of −10 dB and higher being colored. It can be seen from FIG. 21 that the electric field is stronger at the connection point A and weaker at the connection point B.

The fact that when a cable is connected to a position where the electric field is strong on the ground plane the common-mode current increases, and the radiation level becomes higher will be described based on calculated results.

Figure 22:
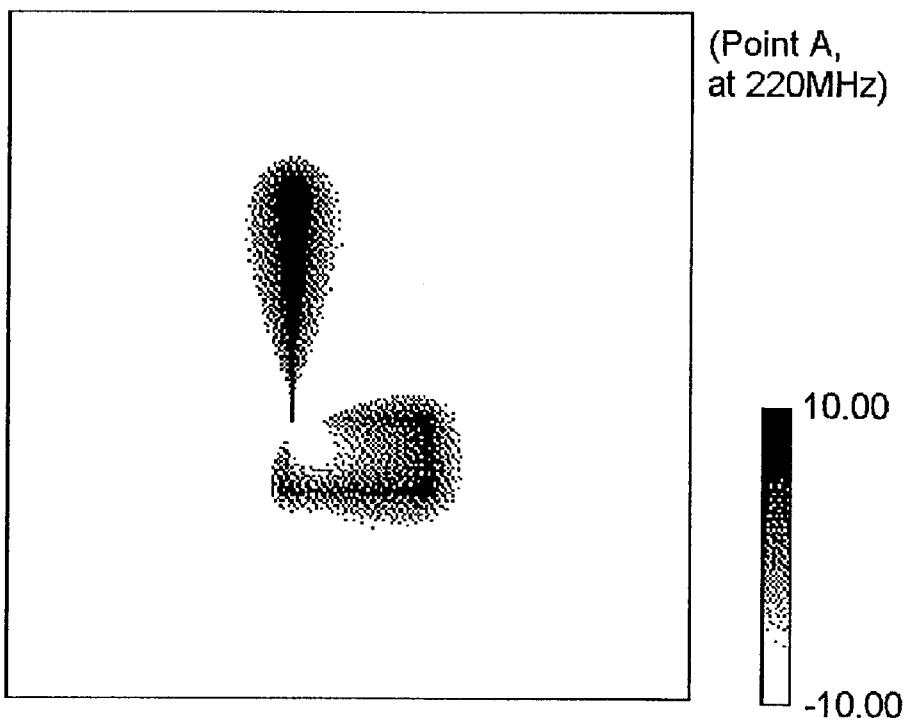
FIG. 22 is a plan view showing an electric field intensity distribution with a cable connected to a point A.
Figure 23:
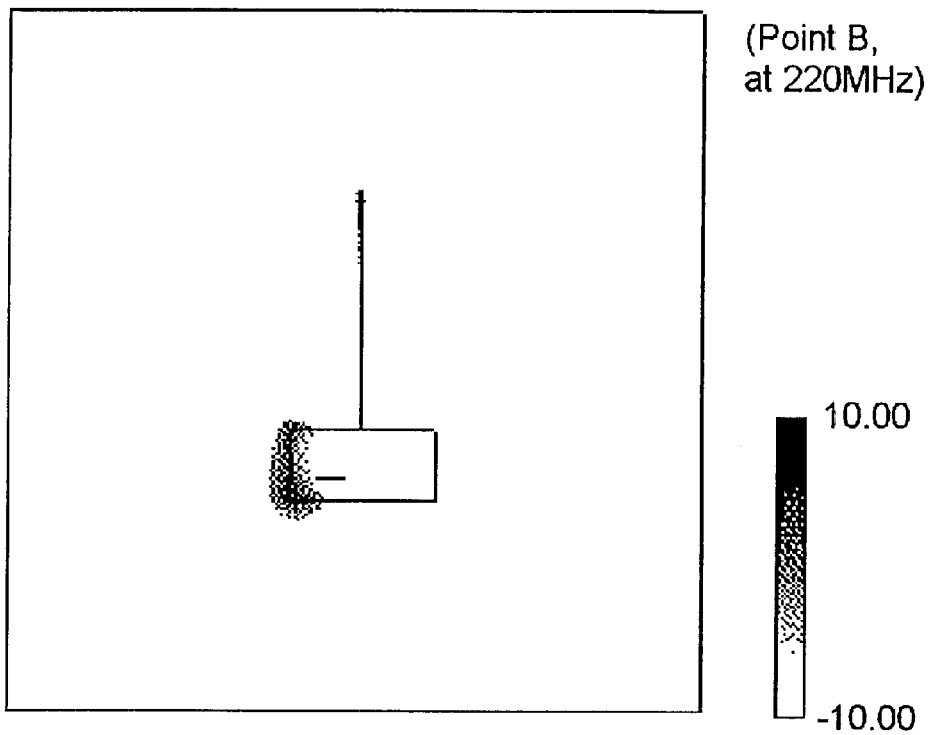
FIG. 23 is a plan view showing an electric field intensity distribution with a cable connected to a point B.

Calculated results of electric field intensity distributions when cables that are 34 cm long are connected to assumed positions A, B in the electric field intensity distribution shown in FIG. 21 are shown respectively in FIGS. 22 and 23. When the cable is connected to point A, the electric field is stronger at the tip end of the cable and on the right end of the ground plane, as shown in FIG. 22, and the intensity of the electric field is nearly 10 dB stronger than if no cable is connected as shown in FIG. 21. When the cable is connected to point B, the electric field on the cable is not increased, as shown in FIG. 23, and the intensity of the electric field remains substantially the same as if no cable is connected as shown in FIG. 21. While no magnetic field intensity distribution is shown here, the magnetic field due to the common-mode current on the cable was stronger when the cable was connected to point A than when the cable was connected to point B.

The above results indicate that when a cable is connected to a region such as point A where the electric field intensity would be strong in the vicinity of the ground plane in the absence of the cable, the system composed of the cable and the ground plane is strongly excited, resulting in a tendency for the common-mode current to flow easily.

Figure 24:
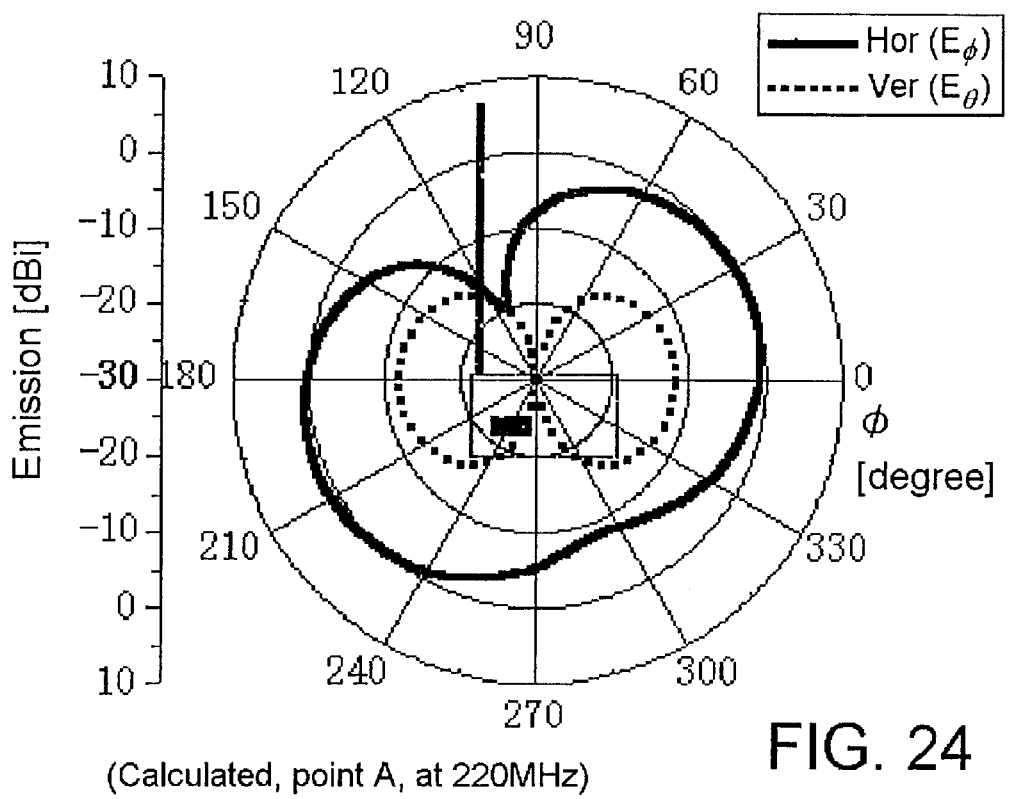
FIG. 24 is a diagram showing a radiation pattern with the cable connected to the point A.
Figure 25:
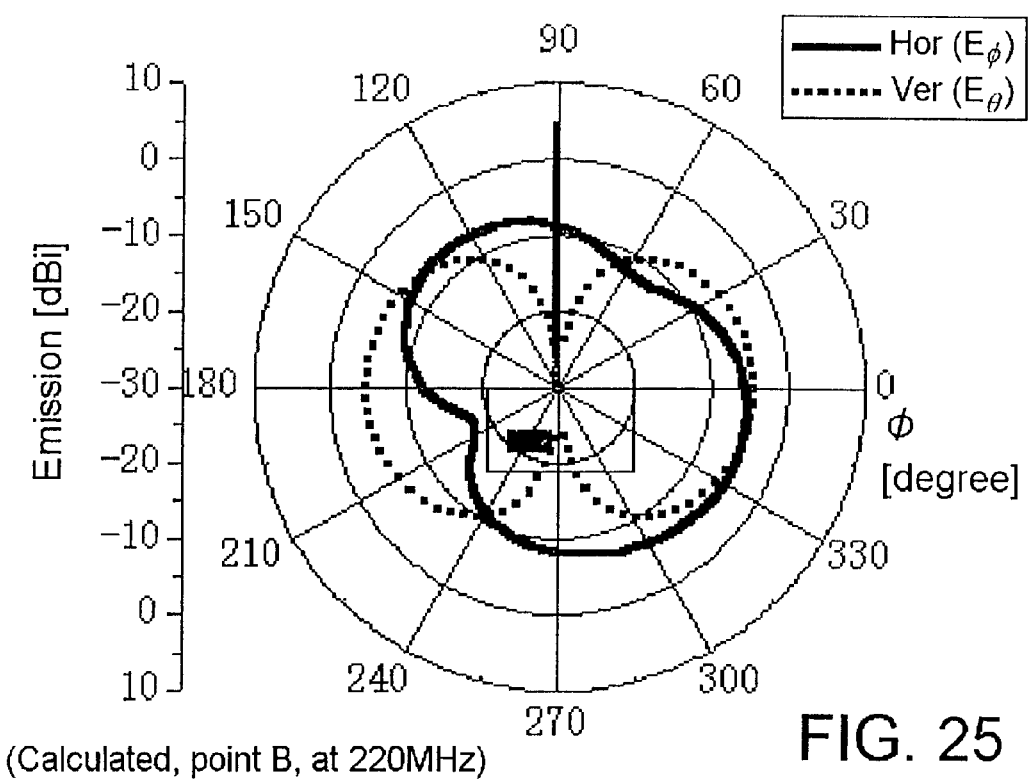
FIG. 25 is a diagram showing a radiation pattern with the cable connected to the point B.

FIGS. 24 and 25 are graphs showing calculated results of radiation patterns in the board plane when cables are connected to points A, B, respectively. It is clearly indicated in FIGS. 24 and 25 that the radiation level is higher when the cable is connected to point A. Since when the cable is connected to the region where the electric field is strong, both the cable and the ground plane are excited to radiate a strong electromagnetic wave, paying attention to the intensity of the electric field in the vicinity of the ground plane makes it possible to assist in optimally designing an electronic device that comprises a cable and a printed-circuit board and in which a common-mode current is difficult to flow.

Design assisting systems according to other embodiments of the present invention, based on the design assisting system according to the fourth embodiment, will be described below.

Figure 26:
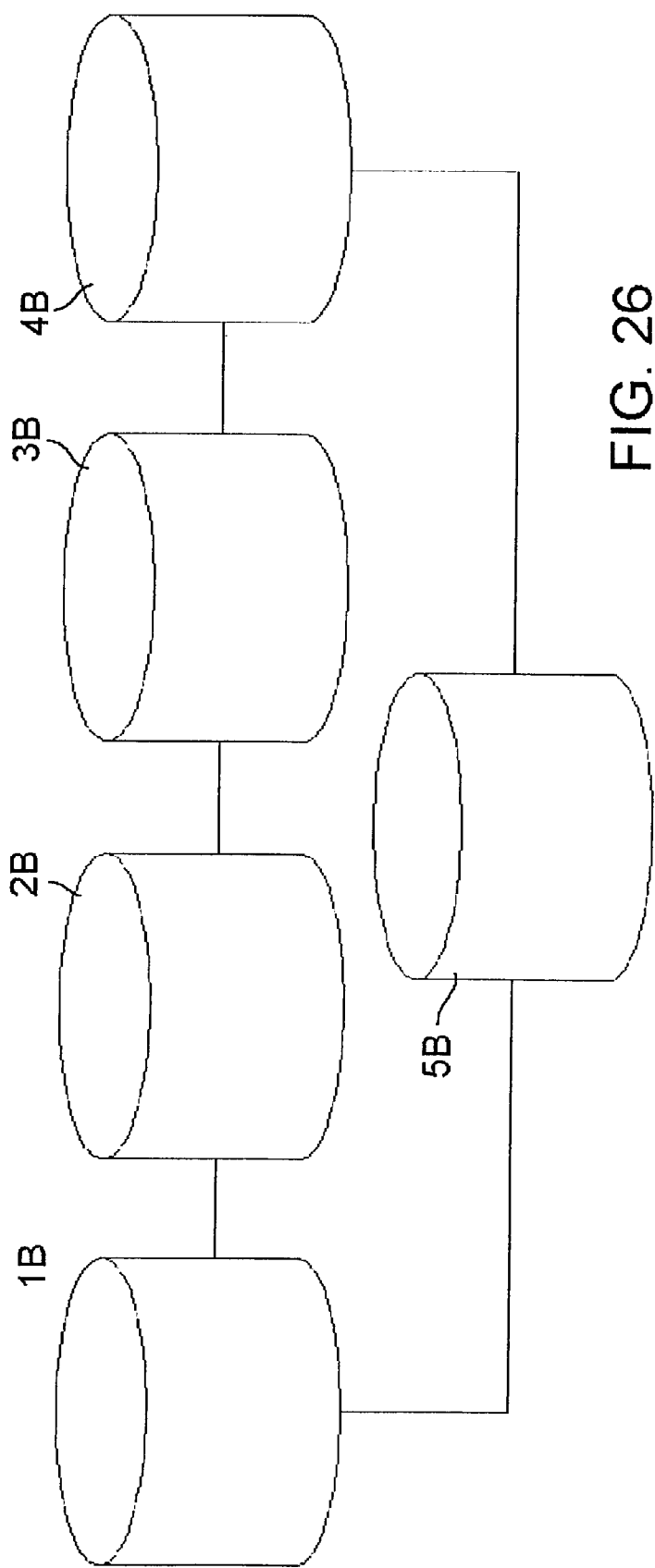
FIG. 26 is a block diagram showing a design assisting system according to a fifth embodiment of the present invention.
Figure 27:
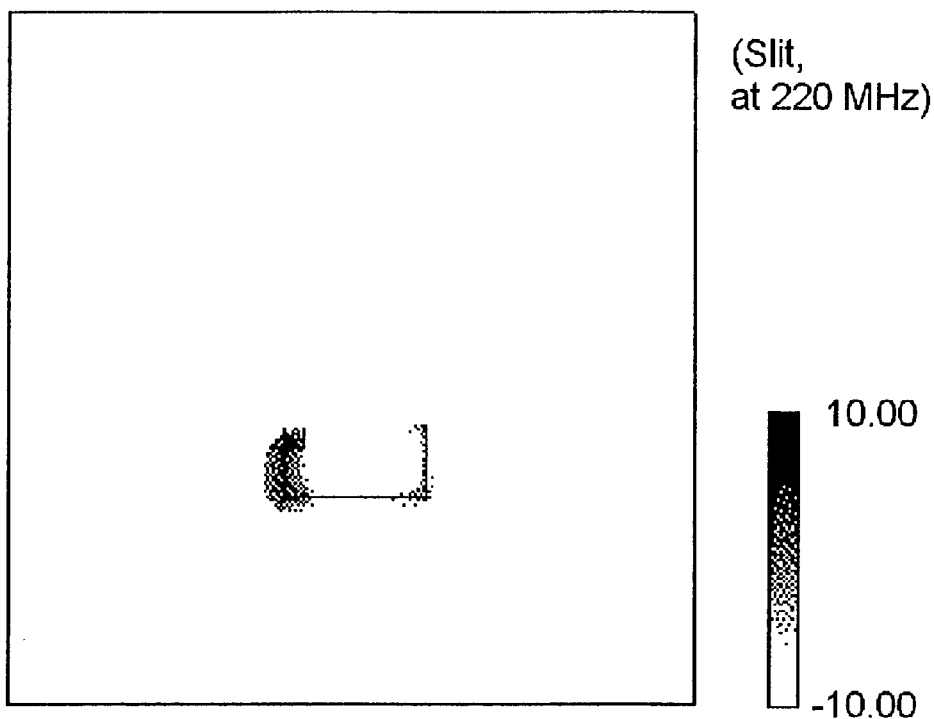
FIG. 27 is a plan view showing an electric field intensity distribution with a slit defined in a ground plane.
Figure 28:
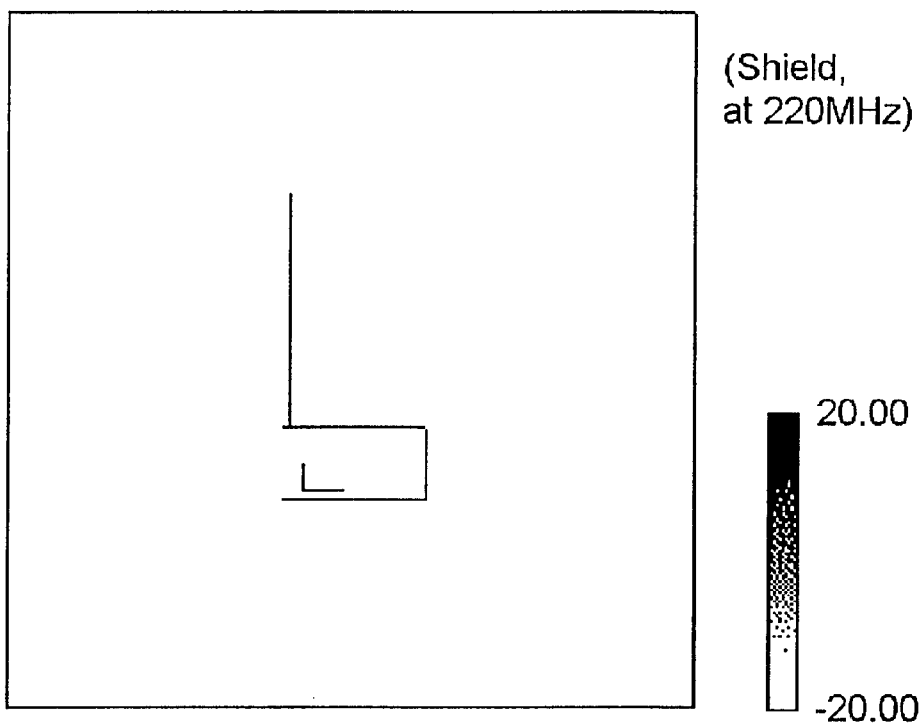
FIG. 28 is a plan view showing an electric field intensity distribution with case of that an interconnection and an electronic device portion are shielded.
Figure 29:
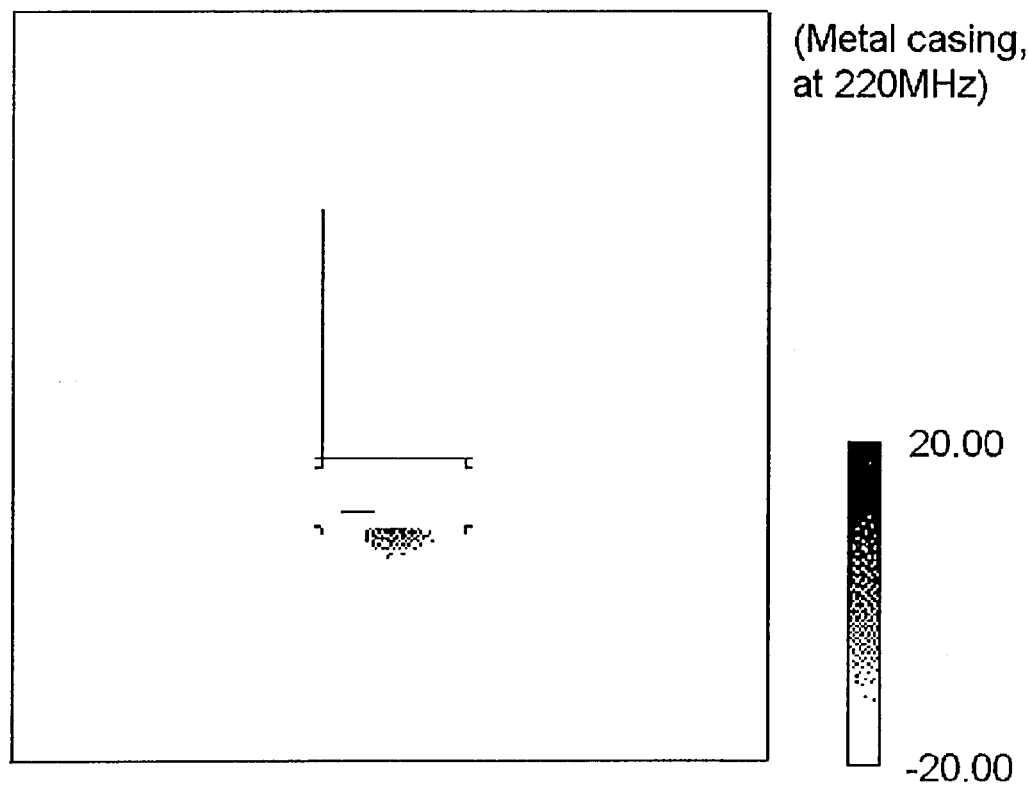
FIG. 29 is a plan view showing an electric field intensity distribution with a metal casing provided.

FIG. 26 shows a design assisting system according to a fifth embodiment of the present invention. The design assisting system according to the fifth embodiment is a combination of the design assisting system according to the fourth embodiment and tool 5B for changing the layout information of a printed-circuit board. Specifically, tool 5B is effective to change the ground plane shape, shield the interconnection and the electronic device, add a metal casing near the board, add a filter to the interconnection, or add a magnetic sheet. FIG. 27 shows an example in which tool 5B has changed the ground plane shape by slitting the ground plane. FIG. 28 shows an example in which tool 5B has shielded the interconnection and the electronic device with a shield case. FIG. 29 shows an example in which tool 5B provides a metal casing, which is of the same size as the ground plane, placed over the interconnection, and the four corners of the metal casing are connected to the ground plane. In each of the examples, it is expected that the electric field near the cable and the ground plane is weaker than the result shown in FIG. 22, and the radiation is suppressed. With tool 5B, or a board layout changing means, being added, the design assisting system is capable of making an optimum layout change and assisting in designing an electronic device with reduced radiation while checking whether the layout is of a design where the common-mode current is difficult to flow.

Figure 30:
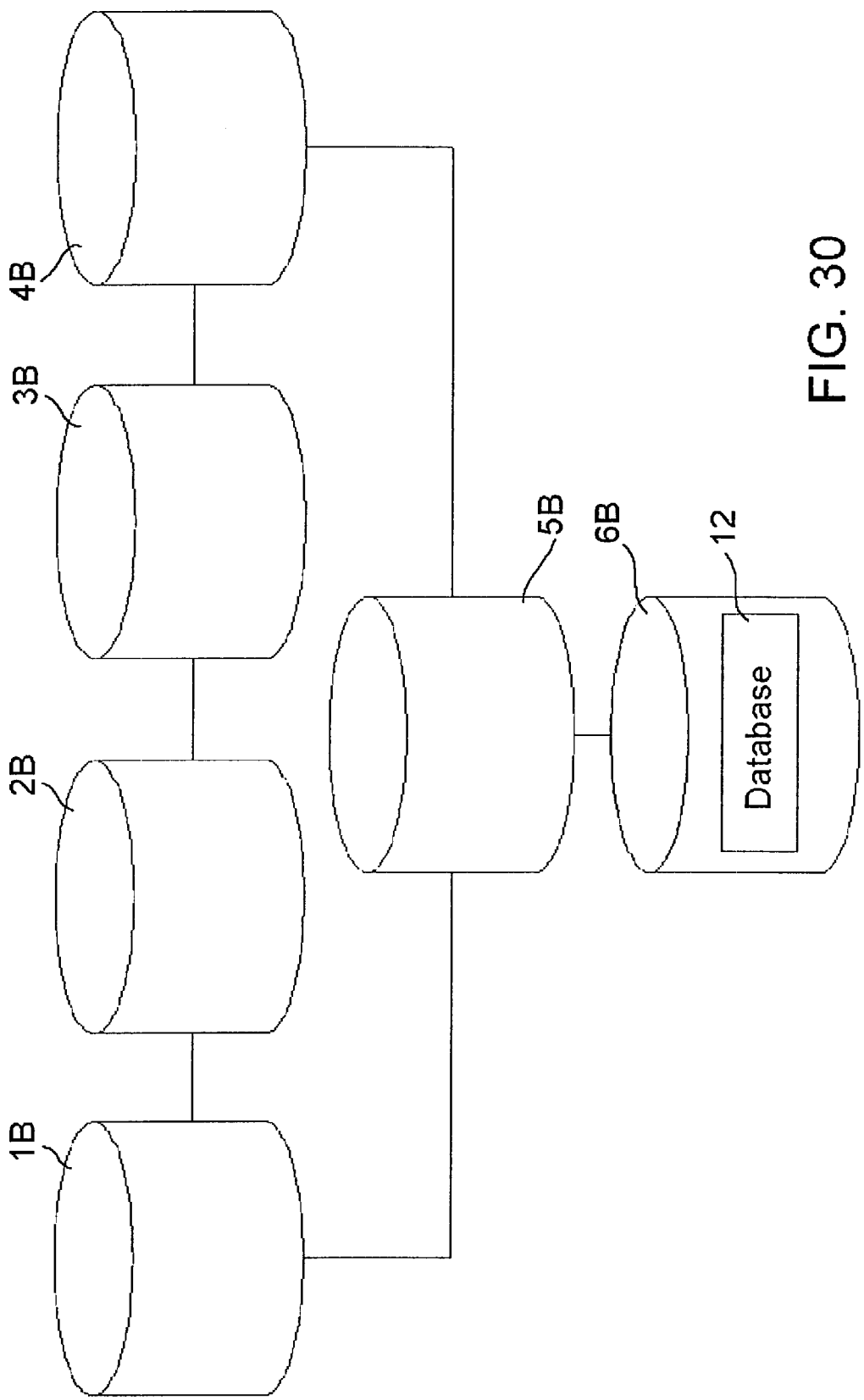
FIG. 30 is a block diagram showing a design assisting system according to a sixth embodiment of the present invention.
Figure 31:
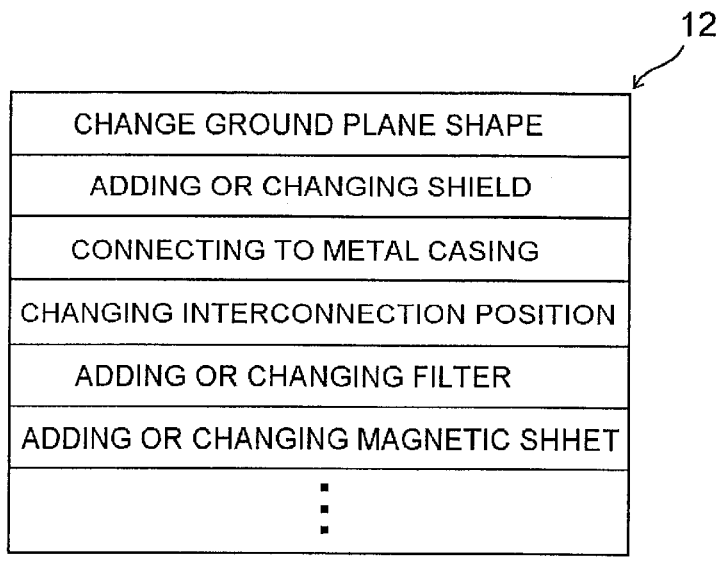
FIG. 31 is a diagram showing the structure of a database provided in the design assisting system shown in FIG. 30.

FIG. 30 shows a design assisting system according to a sixth embodiment of the present invention. The design-assisting system according to the sixth embodiment is a combination of the design assisting system according to the fifth embodiment and tool 6B for storing database 12 of changes that can be made by tool 5B or the board layout changing means. As shown in FIG. 31, tool 6B stores database 12 having a list of items representing changes that can be made, and serves to support tool 5B in changing the board layout. For example, the items in database 12 include "CHANGING GROUND PLANE SHAPE", "ADDING OR CHANGING SHIELD", "CONNECTING TO METAL CASING", "CHANGING INTERCONNECTION POSITION", "ADDING OR CHANGING FILTER", "ADDING OR CHANGING MAGNETIC SHEET", etc. With database 12 prepared in advance by a circuit engineer who is skilled in designing printed-circuit boards, an engineer who is not so skilled in designing printed-circuit boards can design printed-circuit boards in the same manner as the skilled engineer, using the database of tool 6B. According to the sixth embodiment, therefore, unskilled engineers can design optimum printed-circuit boards in a short period of time in the same manner as skilled engineers, based on database 12 which includes layout changes that can be made.

In the fourth through sixth embodiments, it is expected that an assumed position where a cable is connected is determined to a certain extent. Now, a design assisting system capable of newly finding an optimum position for cable connection as no assumed position where a cable is connected has been determined will be described below.

Figure 32:
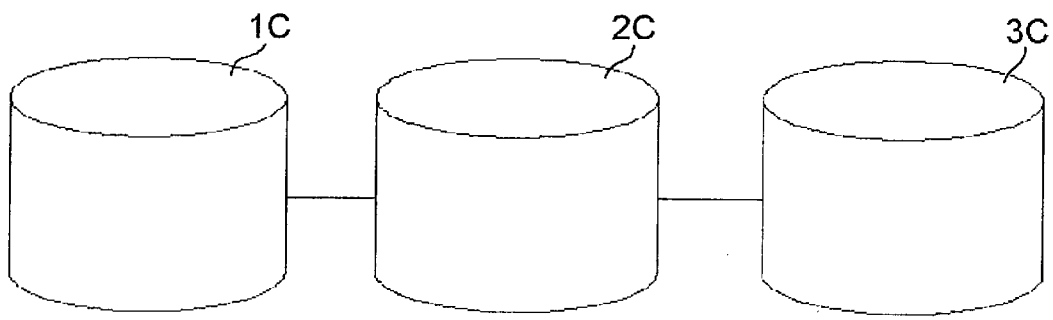
FIG. 32 is a block diagram showing a design assisting system according to a seventh embodiment of the present invention.

FIG. 32 shows a design assisting system according to a seventh embodiment of the present invention. The design assisting system according to the seventh embodiment comprises tool 1C for generating a model for analyzing an electromagnetic field from the layout information of a printed-circuit board, tool 2C for specifying a frequency and calculating an electric field intensity distribution in the vicinity of the ground plane, and tool 3C for finding a region where the electric field is weak as a region suitable for cable connection and outputting the position of the region. Tool 1C for generating a model for analyzing an electromagnetic field is identical to tools 1A, 1B described above in the first through sixth embodiments, and tool 2C for calculating an electric field intensity distribution is identical to tool 3B described above in the fourth through sixth embodiments.

Figure 33:
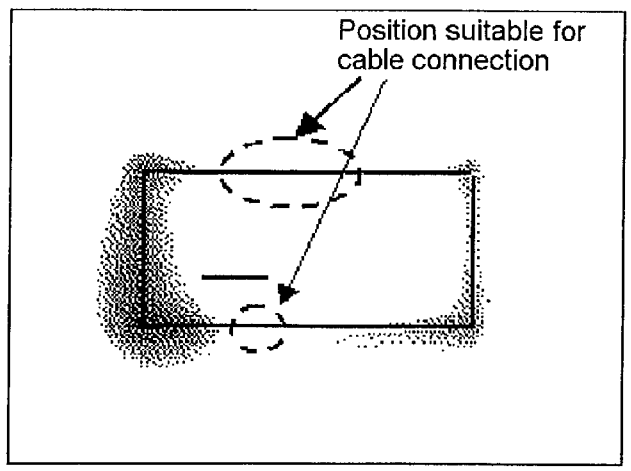
FIG. 33 is a plan view showing a position suitable for the connection of a cable.

Tool 3C superposes the layout diagram of the printed-circuit board and the electric field intensity distribution in the vicinity of the ground plane, finds a region where the electric field is weak as a region suitable for cable connection, and thereafter visually displays the region suitable for cable connection. FIG. 33 shows an example in which the electric field intensity distribution in the vicinity of the ground plane and the board layout are displayed together, and regions suitable for cable connection, which are regions where the electric field is weak, are surrounded by the dotted lines. By paying attention to an electric field in the vicinity of the ground plane, finding a region where the electric field is weak as a region suitable for cable connection, and visually displaying the region, it is possible for the designer to instantaneously determine a place which is suitable for cable connection.

While the preferred embodiments of the present invention have been described above, the modeling of an electronic device, which is indispensable for reducing the present invention to practice will be described in further detail below.

For modeling an electronic device, as shown in FIGS. 6A and 6B, a transmission LSI circuit is divided into a lead frame and a chip, and the lead frame is modeled as a metal wire and the chip as a voltage source. The voltage source is disposed parallel to the ground plane because the LSI chip is physically disposed parallel to the ground plane.

Figure 34:
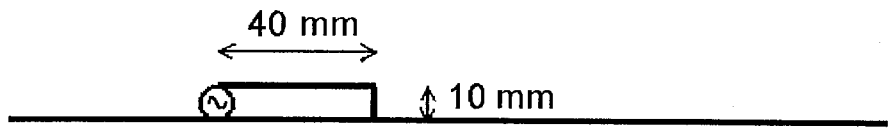
FIG. 34 is a view showing the layout of a voltage source arranged according to a conventional layout method.

For evaluating a differential-mode current, i.e., the transmission characteristics of a circuit, using an electromagnetic field analyzing method, it has been customary to regard an active device as a voltage source and place the voltage source perpendicularly to the ground plane between a signal interconnection and the ground plane, as described in IEEE MICROWAVE AND GUIDE WAVE LETTERS, VOL. 6, NO. 5, MAY 1996, PP. 199–201, for example. FIG. 34 shows an example in which a voltage source is thus disposed perpendicularly to a ground plane between an interconnection and the ground plane. This method serves to pass currents, which are 180° out of phase with each other, through the interconnection and the ground plane because a differential-mode current flowing through the signal interconnection and the ground plane that are paired is analyzed.

In order to investigate the common-mode current characteristics of the ground plane and radiation characteristics due to the common-mode current, however, it is more important to reproduce an LSI model close to an actually mounted form than to pass an ideal differential-mode current through the interconnection and the ground plane.

Figure 35A:
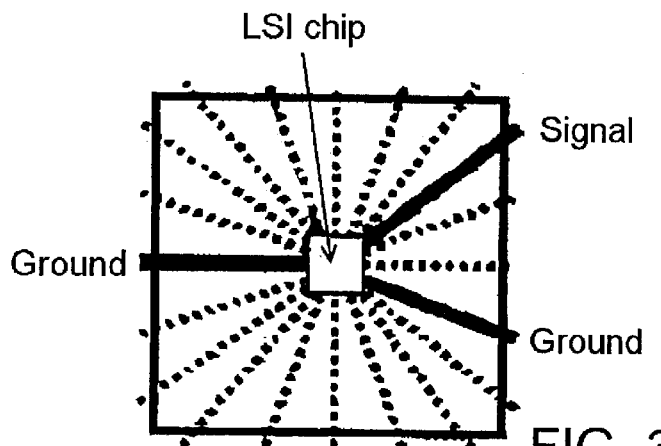
FIGS. 35A and 35B are plan and cross-sectional views, respectively, of an example of structure of an LSI package.
Figure 35B:
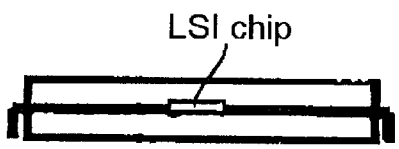
Figure 36A:
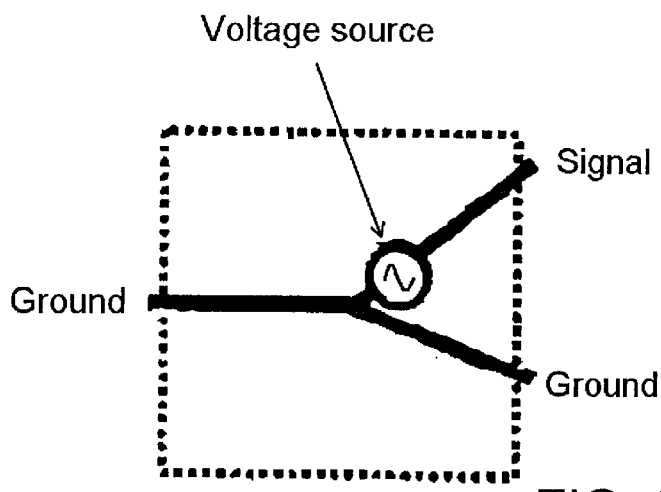
FIGS. 36A and 36B are plan and cross-sectional views, respectively, representing the structure of the LSI package shown in FIGS. 35A and 35B as a model for analyzing an electromagnetic field.
Figure 36B:

FIGS. 35A and 35B illustrate an example of an LSI package structure and the package structure can be represented by a model for analyzing an electromagnetic field as shown in FIGS. 36A and 36B. In general, an LSI package has a flattened structure and an LSI chip which outputs signals is disposed at the center of the package so that the LSI chip is arranged in parallel to the package. Thus, when an LSI chip is represented by a voltage source, a model which is more close to the actual structure can be obtained by arranging the voltage source in parallel to the ground plane of the circuit board. Further, the LSI chip is connected to lead frames connecting to a signal interconnection and a grounding point on the circuit board. If these connection structure of the lead frames and LSI chip is to be represented, a model which is more close to the actual structure also can be obtained by arranging the voltage source representing the LSI chip in parallel to the ground plane. FIGS. 36A and 36B illustrate an example in which a connection portion among one lead frame connecting a signal interconnection and two lead frames connecting the grounding points is modeled. As shown in the figures, an LSI package with a flattened structure is well represented.

The manner in which the magnitude of the voltage source is determined will be described below. In the calculations according to the above embodiments, there has been used a voltage source having no internal resistance and a magnitude of 1 V. Therefore, the absolute value of a radiation level is not calculated. If the absolute value of a radiation level is to be calculated, then there are available two processes. According to one process, the voltage value is determined from an equivalent circuit model of an LSI circuit used in a circuit simulator or a transmission line simulator. According to the other process, the voltage value is determined from measured results of voltage or current characteristics of respective terminals of an LSI circuit or measured results of electric or magnetic field characteristics in the vicinity of an LSI circuit.

Circuit simulators and transmission line simulators are tools widely used at present for inspecting reflections and delays of signal waveforms. One famous example of those circuit simulators and transmission line simulators is SPICE. When supplied with electric characteristics of respective terminals of an LSI circuit as numerical data, such a simulator can calculate signal waveforms between the terminals of the LSI circuit that is placed on a printed-circuit board. In view of strong demands for the recognition of the characteristics of signal waveforms at the stage of board designing, those simulators are in widespread usage today. Electronic device manufacturers disclose equivalent circuit models of LSI circuits and parameters thereof for use as such simulators.

According to the present invention, the value of a voltage source for use in an analysis of an electromagnetic field is determined based on an LSI model disclosed for use as a circuit simulator or a transmission line simulator. Using such a process, it is not necessary to prepare a new LSI model for use in an analysis of an electromagnetic field, other than a circuit simulation, and the voltage value can be determined in a short period of time.

Other processes of determining the value of a voltage source include a process of measuring time-domain voltage waveforms of respective LSI terminals and a voltage-to-frequency spectrum with a voltage probe and an oscilloscope or a spectrum analyzer, and determining the value of a voltage source based on the measured data, and a process of measuring an electric field intensity distribution or a magnetic field intensity distribution in the vicinity of an LSI circuit, and determining the value of a voltage source based on the measured distribution. By determining the value of a voltage source from these measured results, it is possible to carry out more accurate calculations.

In each of the above embodiments, the magnitude of a common-mode current is determined on the basis of a magnetic field intensity distribution. Since a magnetic field and an electric field are closely related to each other, it is apparent to those skilled in the art that the present invention can be reduced to practice based on an electric field intensity distribution.

The design assisting system according to each of the embodiments is generally incorporated as a CAD system function into a CAD system. Specifically, the design assisting system can be realized by reading a computer program for achieving various tools in the design assisting system into a general computer such as a supercomputer or a work station, and executing the computer program. The program for realizing the design assisting system is read from a recording medium such as a magnetic tape or a CD-ROM into the computer. The computer typically comprises a central processing unit (CPU), a hard disk storing programs and data, a main memory, an input device including a keyboard and a mouse, a display unit such as a CRT, and a reading unit for reading the recording medium such as a magnetic tape or a CD-ROM. The recording medium which stores the program for causing the computer to function as the design assisting system or its tools is inserted in the reading unit, which reads the program from the recording medium into the hard disk, and the program stored in the hard disk is executed by the central processing unit to enable the computer to function as the design assisting system.

While preferred embodiments of the present invention have been described using specific terms, such description is for illustrative purposes only, and it is to be understood that changes and variations may be made without departing from the spirit or scope of the following claims.

What is claimed is:

1. A design assisting system comprising:
   means for converting at least a set of an electronic device, an interconnection, and a ground plane from layout information of a circuit board into a model for analyzing an electromagnetic field;
   means for specifying a frequency and calculating a magnetic field intensity distribution near the ground plane using said model at the specified frequency; and
   means for superposing the calculated magnetic field intensity distribution and a position of said interconnection, determining whether a position where a magnetic field or a current is strong and the position of said interconnection are close to each other or not, and outputting a determined result.

2. A design assisting system according to claim 1, further comprising:
   means for changing the layout information of the circuit board.

3. A design assisting system according to claim 2, further comprising:
   means for holding information above possible layout changes as a database.

4. A design assisting system according to claim 1, wherein said model of the electronic device comprises a metal wire and a voltage source, and said voltage source is disposed parallel to said ground plane.

5. A design assisting system comprising:
   means for converting at least a set of an electronic device, an interconnection, and a ground plane from layout information of a circuit board into a model for analyzing an electromagnetic field;
   means for entering an assumed position where a cable is connected;
   means for specifying a frequency and calculating an electric field intensity distribution near the ground plane using said model; and
   means for determining whether a position where an electric field is strong and said assumed position are in agreement with each other or not, and outputting a determined result.

6. A design assisting system according to claim 5, further comprising:
   means for changing the layout information of the circuit board.

7. A design assisting system according to claim 6, further comprising:
   means for holding information above possible layout changes as a database.

8. A design assisting system according to claim 5, wherein said model of the electronic device comprises a metal wire and a voltage source, and said voltage source is disposed parallel to said ground plane.

9. A design assisting system comprising:
   means for converting at least a set of an electronic device, an interconnection, and a ground plane from layout information of a circuit board into a model for analyzing an electromagnetic field;
   means for specifying a frequency and calculating an electric field intensity distribution near the ground plane using said model; and
   means for finding a position whether an electric field is weak as a position suitable for cable connection, and outputting the position.

10. A design assisting system according to claim 9, further comprising:
    means for changing the layout information of the circuit board.

11. A design assisting system according to claim 10, further comprising:
    means for holding information above possible layout changes as a database.

12. A design assisting system according to claim 9, wherein said model of the electronic device comprises a metal wire and a voltage source, and said voltage source is disposed parallel to said ground plane.

13. A design assisting method comprising the steps of:
    converting at least a set of an electronic device, an interconnection, and a ground plane from layout information of a circuit board into a model for analyzing an electromagnetic field;
    specifying a frequency;
    calculating a magnetic field intensity distribution near the ground plane using said model at the specified frequency;
    superposing the calculated magnetic field intensity distribution and a position of said interconnection thereby to determine whether a position where a magnetic field or a current is strong and the position of said interconnection are close to each other or not; and
    outputting a determined result.

14. A design assisting method according to claim 13, wherein said model of the electronic device comprises a metal wire and a voltage source, and said voltage source is disposed parallel to said ground plane.

15. A design assisting method according to claim 14, wherein a value of said voltage source is extracted from a model of the electronic device for a circuit simulator.

16. A design assisting method according to claim 14, wherein a value of said voltage source is determined based on a measured result of at least one selected from a group consisting of a voltage between terminals of said electronic device, a current at a terminal of said electronic device, an electric field near said electronic device, and a magnetic field near said electronic device.

17. A design assisting method comprising the steps of:

converting at least a set of an electronic device, an interconnection, and a ground plane from layout information of a circuit board into a model for analyzing an electromagnetic field;

specifying a frequency;

calculating a magnetic field intensity distribution near the ground plane using said model at the specified frequency; and superposing the calculated magnetic field intensity distribution and a position of said interconnection, and determining whether a position where a magnetic field is strong and the position of said interconnection are close to each other or not; and if the position where a magnetic field is strong and the position of said interconnection are close to each other, changing a layout of said circuit board, and effecting again said step of calculating and said step of superposing and determining.

18. A design assisting method according to claim 17, wherein said step of changing comprises the step of changing the layout of said circuit board using a database of possible layout changes.

19. A design assisting method comprising the steps of:

converting at least a set of an electronic device, an interconnection, and a ground plane from layout information of a circuit board into a model for analyzing an electromagnetic field;

entering an assumed position where a cable is connected;

specifying a frequency;

calculating an electric field intensity distribution near the ground plane using said model at the specified frequency;

determining whether a position where an electric field is strong and said assumed position are in agreement with each other or not; and outputting a determined result.

20. A design assisting method according to claim 19, wherein said model of the electronic device comprises a metal wire and a voltage source, and said voltage source is disposed parallel to said ground plane.

21. A design assisting method according to claim 20, wherein a value of said voltage source is extracted from a model of the electronic device for a circuit simulator.

22. A design assisting method according to claim 20, wherein a value of said voltage source is determined based on a measured result of at least one selected from a group consisting of a voltage between terminals of said electronic device, a current at a terminal of said electronic device, an electric field near said electronic device, and a magnetic field near said electronic device.

23. A design assisting method comprising the steps of:

converting at least a set of an electronic device, an interconnection, and a ground plane from layout information of a circuit board into a model for analyzing an electromagnetic field;

entering an assumed position where a cable is connected;

specifying a frequency;

calculating an electric field intensity distribution near the ground plane using said model at the specified frequency;

determining whether a position where an electric field is strong and said assumed position are in agreement with each other or not;

if the position where an electric field is strong and said assumed position are in agreement with each other, changing a layout of said circuit board, and effecting again said step of calculating and said step of determining; and outputting a determined result.

24. A design assisting method according to claim 23, wherein said step of changing comprises the step of changing the layout of said circuit board using a database of possible layout changes.

25. A design assisting method comprising the steps of:

converting at least a set of an electronic device, an interconnection, and a ground plane from layout information of a circuit board into a model for analyzing an electromagnetic field;

specifying a frequency;

calculating an electric field intensity distribution near the ground plane using said model at the specified frequency; and finding a position whether an electric field is weak as a position suitable for cable connection based on said electric field intensity distribution.

26. A design assisting method according to claim 25, wherein said model of the electronic device comprises a metal wire and a voltage source, and said voltage source is disposed parallel to said ground plane.

27. A design assisting method according to claim 26, wherein a value of said voltage source is extracted from a model of the electronic device for a circuit simulator.

28. A design assisting method according to claim 26, wherein a value of said voltage source is determined based on a measured result of at least one selected from a group consisting of a voltage between terminals of said electronic device, a current at a terminal of said electronic device, an electric field near said electronic device, and a magnetic field near said electronic device.

29. A recording medium readable by a computer and storing a program which enables said computer to perform a process comprising the steps of:

converting at least a set of an electronic device, an interconnection, and a ground plane from layout information of a circuit board into a model for analyzing an electromagnetic field;

specifying a frequency;

calculating an electric field intensity distribution near the ground plane using said model at the specified frequency;

superposing the calculated magnetic field intensity distribution and the position of said interconnection thereby to determine whether a position where a magnetic field or a current is strong and the position of said interconnection are close to each other or not; and outputting a determined result.

30. A recording medium readable by a computer and storing a program which enables said computer to perform a process comprising the steps of:

converting at least a set of an electronic device, an interconnection, and a ground plane from layout information of a circuit board into a model for analyzing an electromagnetic field;

entering an assumed position where a cable is connected;

specifying a frequency;

calculating an electric field intensity distribution near the ground plane using said model at the specified frequency;

determining whether a position where an electric field is strong and said assumed position are in agreement with each other or not; and outputting a determined result.

31. A recording medium readable by a computer and storing a program which enables said computer to perform a process comprising the steps of:

converting at least a set of an electronic device, an interconnection, and a ground plane from layout information of a circuit board into a model for analyzing an electromagnetic field;

specifying a frequency;

calculating an electric field intensity distribution near the ground plane using said model at the specified frequency; and finding a position whether an electric field is weak as a position suitable for cable connection based on said electric field intensity distribution.

* * * * *